(12) United States Patent
Miura et al.

(10) Patent No.: US 9,711,370 B2
(45) Date of Patent: Jul. 18, 2017

(54) SUBSTRATE PROCESSING APPARATUS AND METHOD OF PROCESSING A SUBSTRATE

(71) Applicant: Tokyo Electron Limited, Tokyo (JP)

(72) Inventors: Shigehiro Miura, Iwate (JP); Hitoshi Kato, Iwate (JP); Jun Sato, Iwate (JP); Hiroyuki Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/831,961

(22) Filed: Aug. 21, 2015

(65) Prior Publication Data

US 2016/0064246 A1 Mar. 3, 2016

(30) Foreign Application Priority Data

Sep. 2, 2014 (JP) .................................. 2014-178216

(51) Int. Cl.
*H01L 21/311* (2006.01)
*C23C 16/52* (2006.01)
*H01L 21/687* (2006.01)
*C23C 16/455* (2006.01)
*H01L 21/02* (2006.01)

(52) U.S. Cl.
CPC .. *H01L 21/31116* (2013.01); *C23C 16/45551* (2013.01); *C23C 16/45578* (2013.01); *C23C 16/52* (2013.01); *H01L 21/0228* (2013.01); *H01L 21/02164* (2013.01); *H01L 21/02219* (2013.01); *H01L 21/68764* (2013.01); *H01L 21/68771* (2013.01)

(58) Field of Classification Search
CPC ......... H01L 21/31116; H01L 21/68764; H01L 21/68771; C23C 16/45551; C23C 16/45578; C23C 16/52
See application file for complete search history.

(56) References Cited

U.S. PATENT DOCUMENTS

| | | | |
|---|---|---|---|
| 2010/0055316 A1* | 3/2010 | Honma | C23C 16/45551 427/255.28 |
| 2011/0039026 A1* | 2/2011 | Kato | C23C 16/402 427/255.26 |
| 2011/0155056 A1* | 6/2011 | Kato | C23C 16/45538 118/719 |

FOREIGN PATENT DOCUMENTS

| | | |
|---|---|---|
| JP | 2003-142484 | 5/2003 |
| JP | 2010-056470 | 3/2010 |
| JP | 2012-209394 | 10/2012 |

* cited by examiner

*Primary Examiner* — Duy Deo
(74) *Attorney, Agent, or Firm* — IPUSA, PLLC

(57) ABSTRACT

A method of processing a substrate is provided. A substrate is placed on a turntable provided in a process chamber. The process chamber includes a process area for supplying an etching gas and a purge area for supplying a purge gas. The process area and the purge area are arranged along a rotational direction of the turntable and divided from each other. The etching gas is supplied into the process area. The purge gas is supplied into the purge area. The turntable rotates to cause the substrate placed on the turntable to pass through the process area and the purge area once per revolution, respectively. A film deposited on a surface of the substrate is etched when the substrate passes the process are. An etching rate of the etching or a surface roughness of the film is controlled by changing a rotational speed of the turntable.

11 Claims, 15 Drawing Sheets

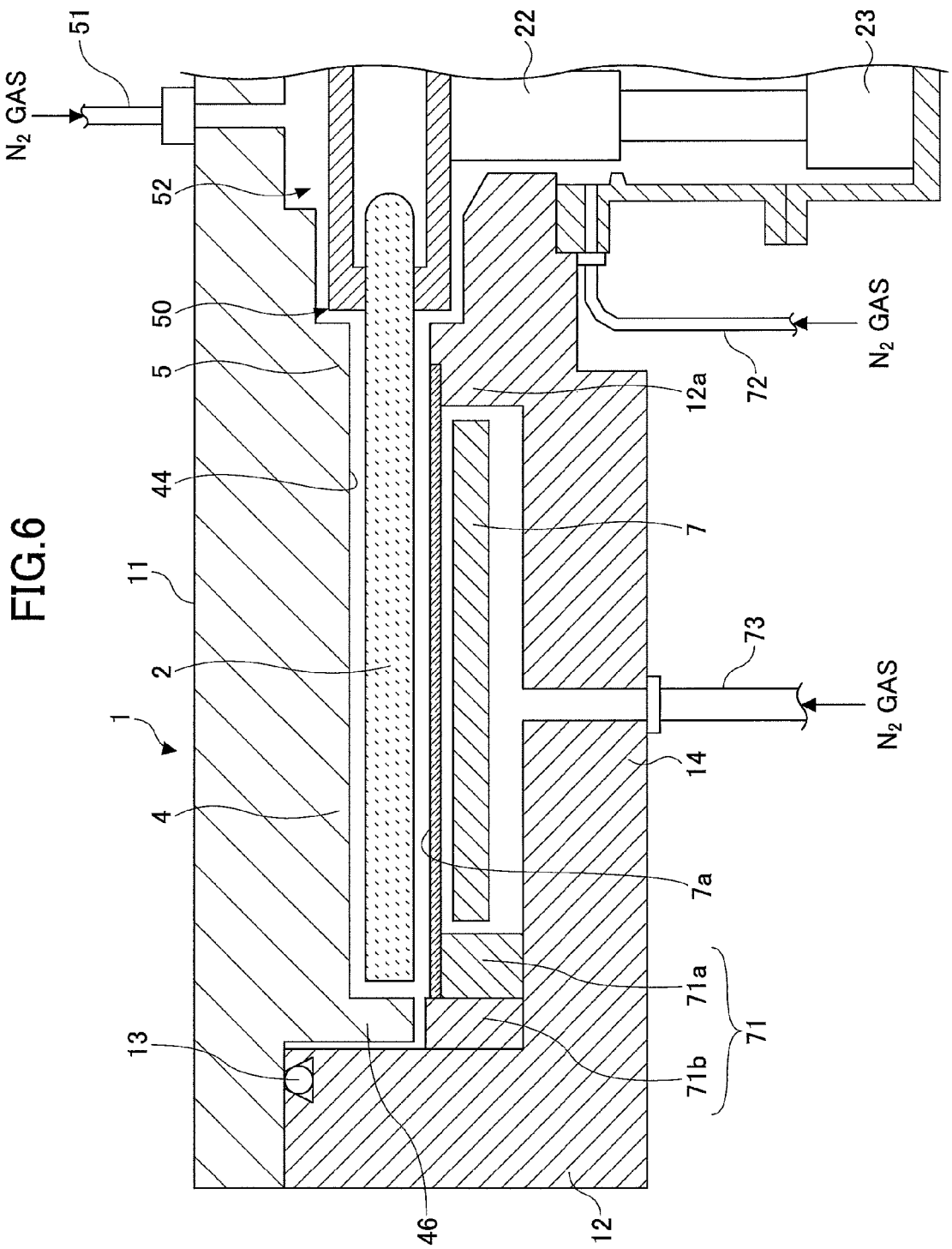

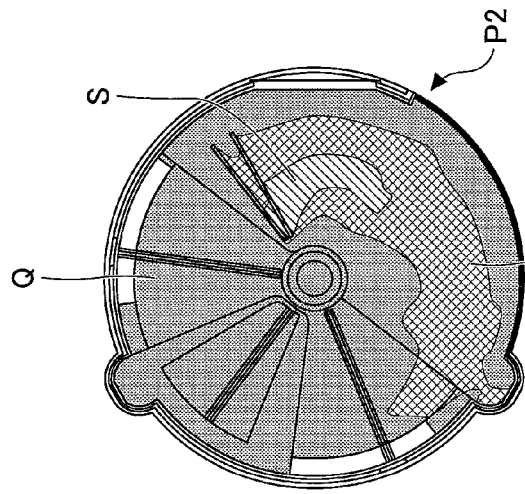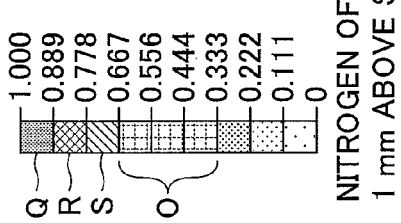
FIG.7A
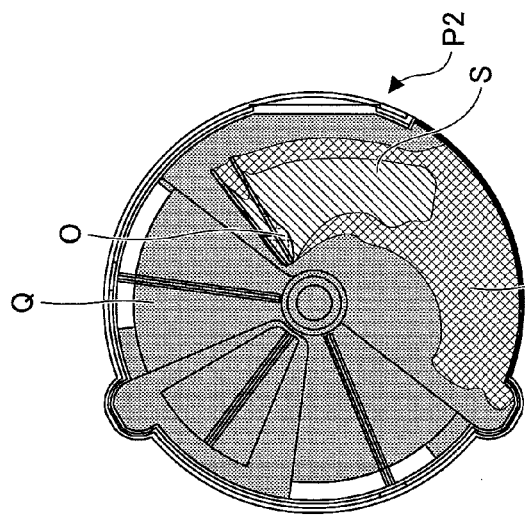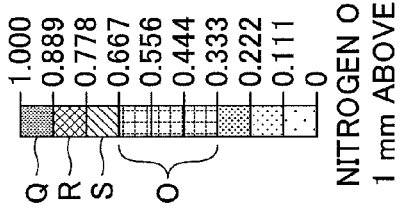
FIG.7B
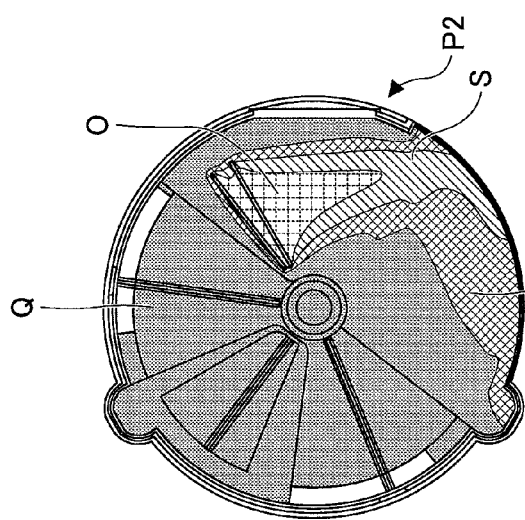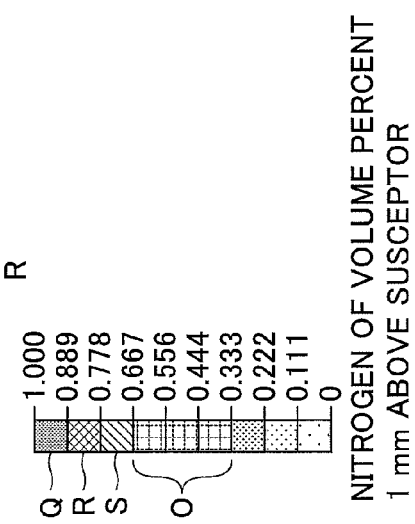
FIG.7C

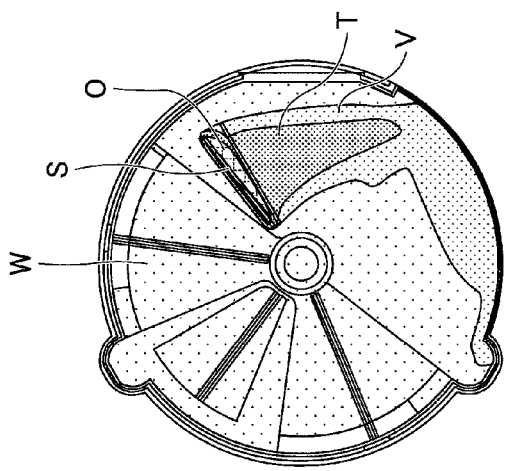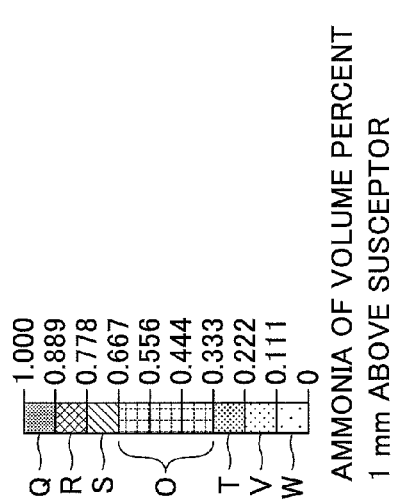
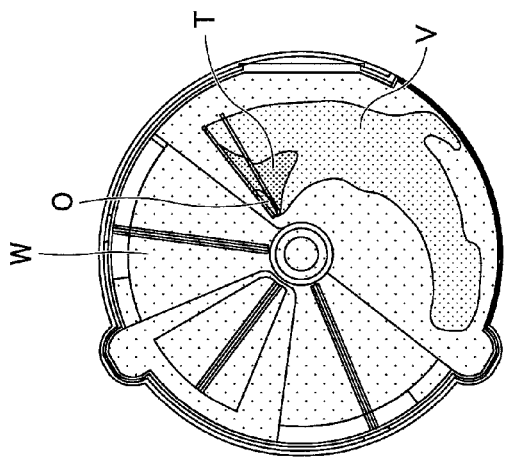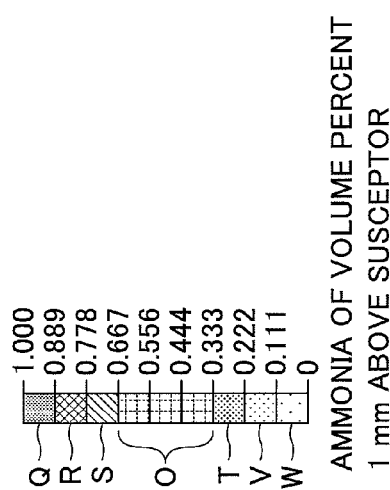
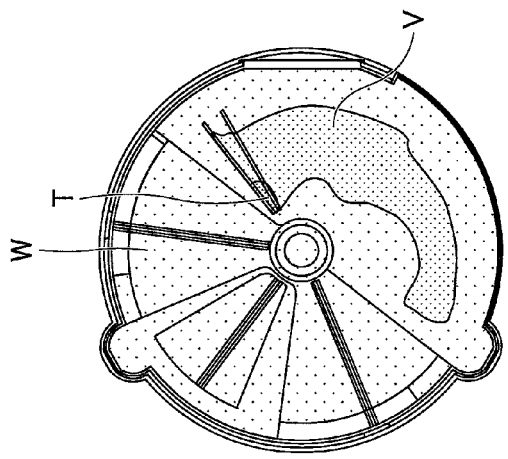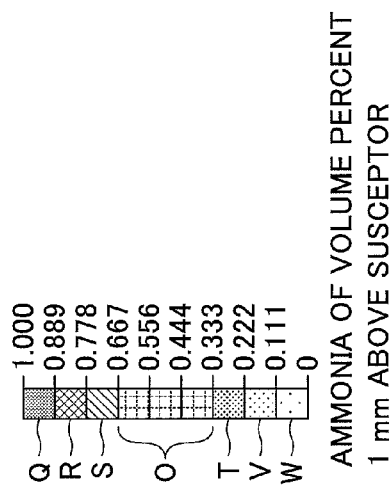

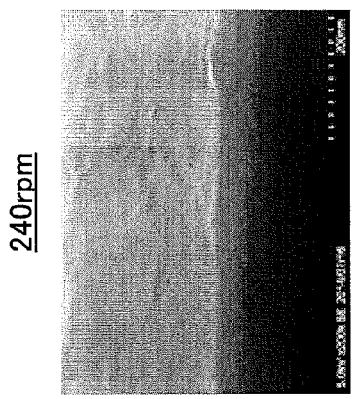
FIG.11D 240rpm
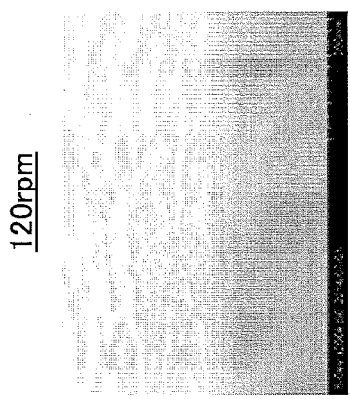
FIG.11C 120rpm
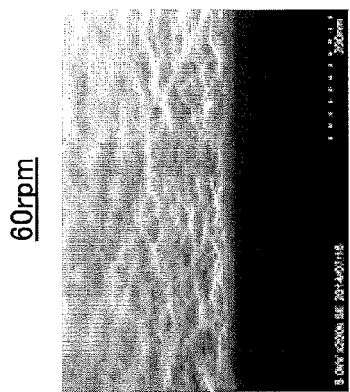
FIG.11B 60rpm
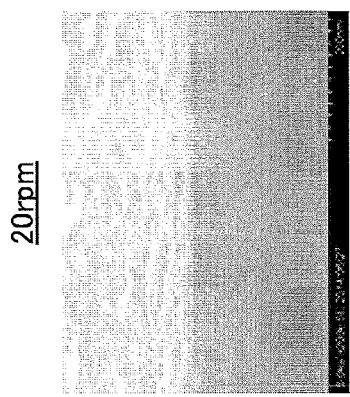
FIG.11A 20rpm
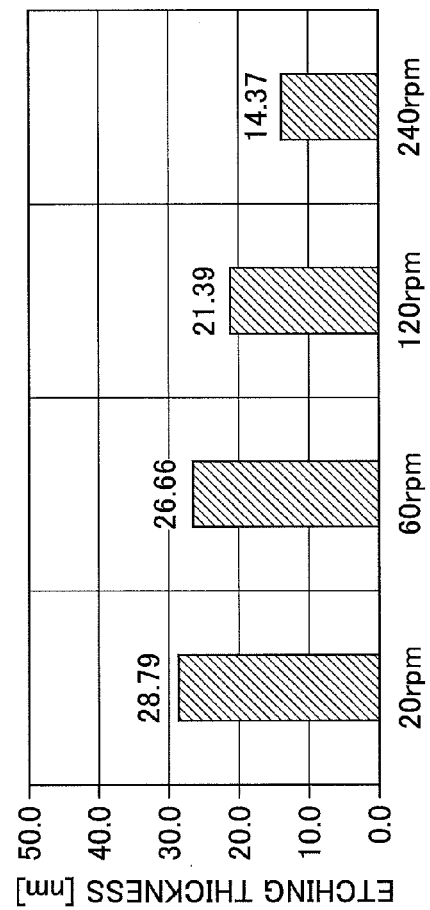
FIG.11F
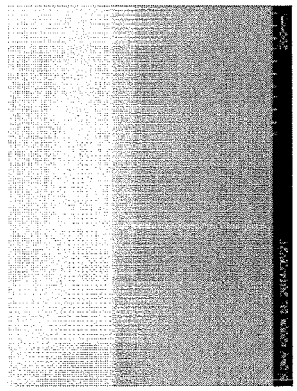
FIG.11E BEFORE ETCHING

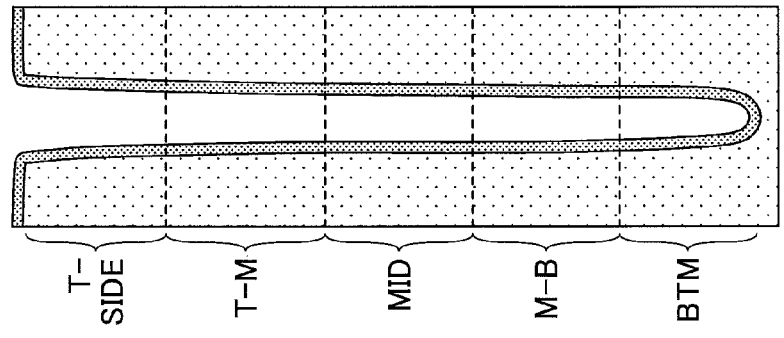
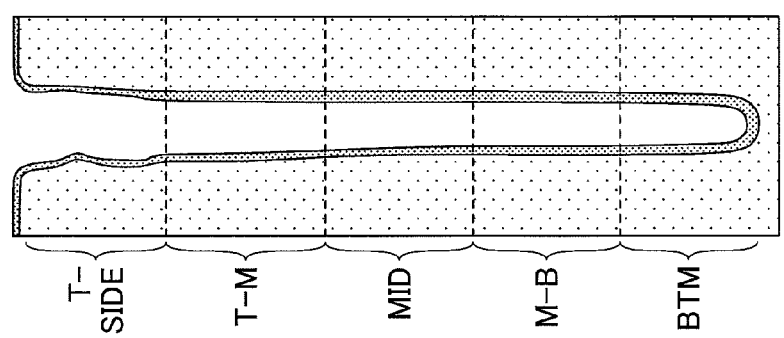
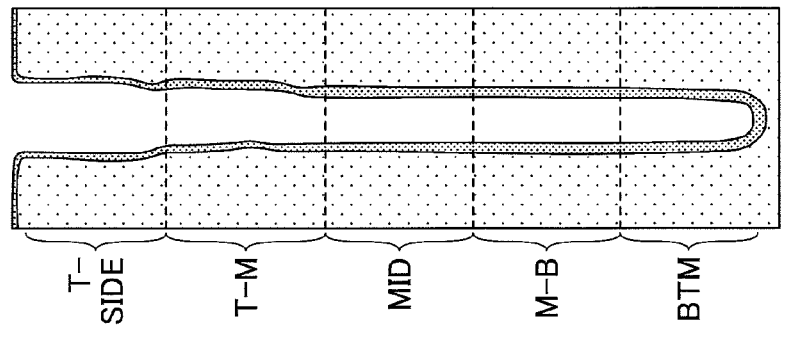
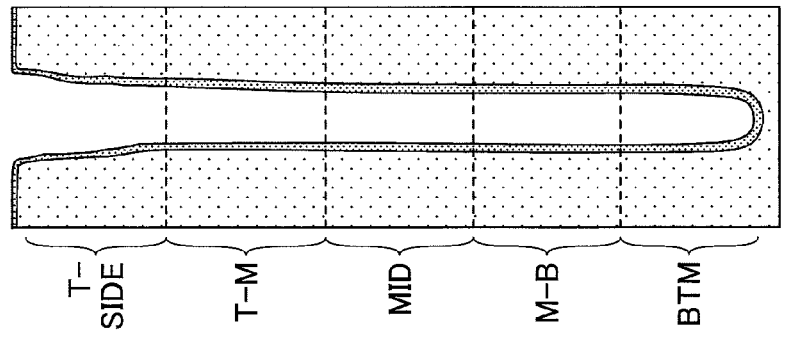
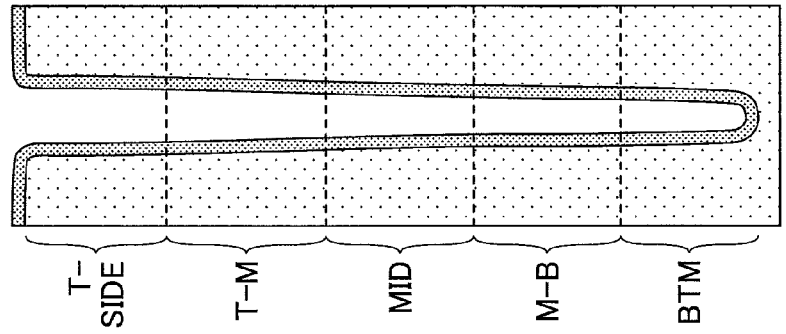

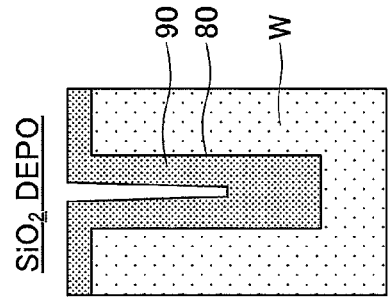
FIG.14A OXIDATION
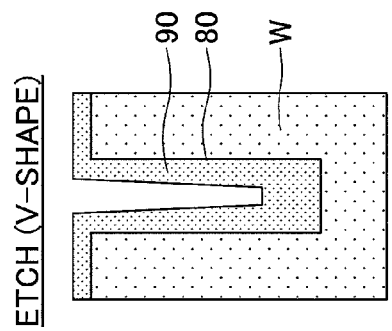
FIG.14B ETCH (V-SHAPE)
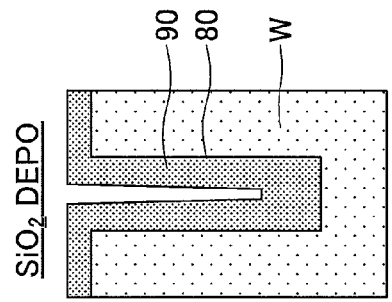
FIG.14C SiO₂ DEPO
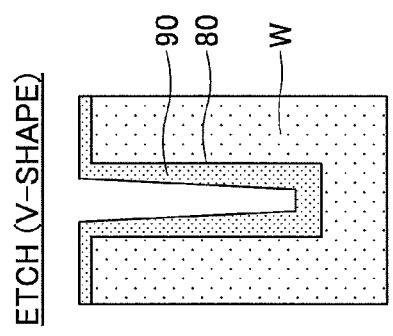
FIG.14D ETCH (V-SHAPE)
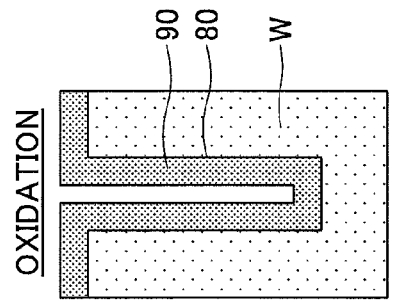
FIG.14E SiO₂ DEPO

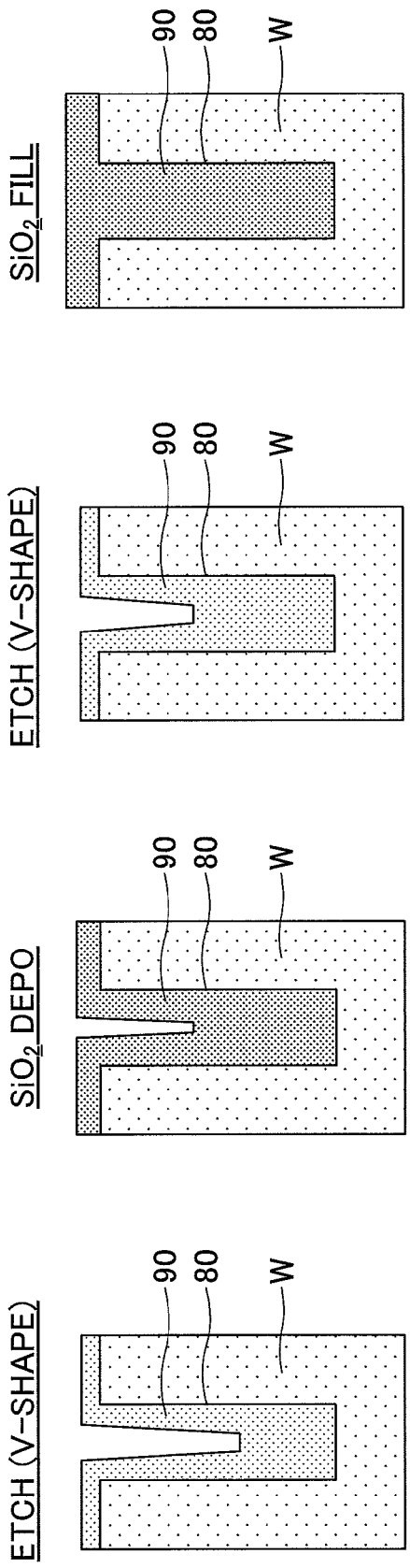

SUBSTRATE PROCESSING APPARATUS AND METHOD OF PROCESSING A SUBSTRATE

CROSS-REFERENCE TO RELATED APPLICATIONS

This patent application is based upon and claims the benefit of priority of Japanese Patent Application No. 2014-178216 filed on Sep. 2, 2014, the entire contents of which are incorporated herein by reference.

BACKGROUND OF THE INVENTION

1. Field of the Invention

The present invention relates to a substrate processing apparatus and a method of processing a substrate.

2. Description of the Related Art

As disclosed in Japanese Patent Application Publication No. 2010-56470, a variety of films constituting semiconductor devices is demanded to be thinner and more uniform with miniaturization of circuit patterns in the semiconductor devices. What is called MLD (Molecular Layer Deposition) or ALD (Atomic Layer Deposition) is known as a film deposition method responding to the demand. In the method, a first reaction gas is absorbed on a surface of a substrate by supplying the first reaction gas to the substrate, and then the first gas adsorbed on the surface of the substrate is caused to react with a second reaction gas by supplying the second reaction gas to the substrate, thereby depositing a film composed of a reaction product of the first reaction gas and the second reaction gas on the substrate. According to such a method of depositing a firm, because the reaction gas can adsorb on the surface of the substrate in a (quisi-)self-saturation manner, high film thickness controllability, excellent uniformity, and excellent filling characteristics can be achieved.

However, with the miniaturization of circuit patterns, for example, filling a trench and a space is sometimes difficult even in the molecular layer deposition method with the increasing aspect ratio of the trench in a trench device separation structure or of a space in a line-and-space pattern.

For example, when trying to fill the space having a width of about 30 nm with a silicon oxide film, because the reaction gas is difficult to go to a bottom part of a narrow space, the film becomes thick in the vicinity of the upper end of a side wall of the line that partitions the space and becomes thin on the bottom part side. This sometimes causes a void to be generated in the silicon oxide film filling the space. For example, when such a silicon oxide film is etched in a subsequent etching process, an opening in communication with the void is sometimes formed in an upper surface of the silicon oxide film. On this occasion, contamination is liable to occur by allowing an etching gas (or an etching solution) to go into the void from the opening, or a defect is liable to occur by allowing metal to go into the void in a subsequent metallization process.

Such a problem can occur in CVD (Chemical vapor Deposition) without being limited to ALD. For example, when forming a conductive contact hole (so-called a plug) by filling a contact hole formed in a semiconductor substrate with a conductive material, a void may be generated in the plug. As disclosed in Japanese Patent Application Publication No. 2003-142484, to prevent this, a method is proposed of forming a conductive contact hole in which a void is reduced by repeating a step of removing overhangs projecting toward the center of the contact hole of the conductive material formed in the upper part or on the top of the contact hole when filling the contact hole with the conductive material by an etch back process.

However, in the invention disclosed in Japanese Patent Application Publication No. 2003-142484, because depositing the film of the conductive material and the etch back process have to be performed by different apparatuses, conveying a wafer between the apparatuses and stabilizing process conditions in each of the apparatuses take time, which causes a problem of not capable of improving the throughput.

Moreover, to solve the problem of the method disclosed in Japanese Patent Application Publication No. 2003-142484, Japanese Patent Application Publication No. 2012-209394 discloses a method of depositing a film and a film deposition apparatus capable of filling a concave-shaped pattern formed in a substrate surface with a film at high throughput while preventing a void from being generated in the film filled in the concave-shaped pattern. Japanese Patent Application Publication No. 2012-209394 discloses a film deposition apparatus that includes a turntable to receive a substrate, first and second reaction gas supply parts capable of supplying first and second reaction gases for film deposition to a substrate receiving surface of the turntable, respectively, and an activated gas supply part to activate and supply a modification gas for modifying a reaction product generated by reaction between the first and second reaction gases and an etching gas for etching, and a film deposition method of repeating a film deposition step and an etching step in sequence by rotating the turntable in the same process chamber by using the above film deposition apparatus.

However, in the film deposition method disclosed in Japanese Patent Application Publication No. 2012-209394, etching conditions such as an etching rate, surface roughness of an etched film and the like cannot be finely controlled, and setting optimum conditions with respect to a balance between the film deposition and the etching is difficult. Depositing a high-quality film has been sometimes difficult depending on a shape of the concave-shaped pattern (e.g., aspect ratio and the like) formed in the substrate surface, a type of film to be deposited and the like.

SUMMARY OF THE INVENTION

Accordingly, embodiments of the present invention may provide a substrate processing apparatus and a method of processing a substrate that can control etching conditions such as an etching rate, surface roughness of an etched film and the like and perform a desired process on a substrate under a variety of conditions.

According to an embodiment of the present invention, there is provided a method of processing a substrate. In the method, a substrate is placed on a turntable provided in a process chamber. The process chamber includes a process area for supplying an etching gas and a purge area for supplying a purge gas. The process area and the purge area are arranged along a rotational direction of the turntable and divided from each other. The etching gas is supplied into the process area. The purge gas is supplied into the purge area. The turntable rotates to cause the substrate placed on the turntable to pass through the process area and the purge area once per revolution, respectively. A film deposited on a surface of the substrate is etched when the substrate passes the process are. An etching rate of the step of etching the film or a surface roughness of the film is controlled by changing a rotational speed of the turntable.

According to another embodiment of the present invention, there is provided a substrate processing apparatus including a process chamber. A turntable to receive a substrate on a surface thereof is provided in the process chamber. The substrate processing apparatus includes a first film deposition gas supply unit to supply a first film deposition gas to the surface of the turntable. A second film deposition gas supply unit to supply a second film deposition gas to the surface of the turntable is provided apart from the first film deposition gas supply unit in a circumferential direction of the turntable. A first etching gas supply unit to supply a first etching gas to the surface of the turntable is provided apart from the first film deposition part and the second film deposition part in the circumferential direction of the turntable. A second etching gas supply unit to supply a second etching gas in a manner directly reactable with the first etching gas before reaching the surface of the turntable is provided close to the first etching gas supply unit.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6 is another partial cross-sectional view of an example of the substrate processing apparatus according to an embodiment of the present invention;

FIGS. 7A through 7C are simulation diagrams illustrating volume concentrations of $N_2$;

FIGS. 9A through 9C are simulation diagrams illustrating volume concentrations of $NH_3$ of the second process area P2 in an etching step;

FIGS. 11A through 11F are diagrams showing experimental results performed for examining a relationship between a rotational speed of a turntable and surface roughness of an etched silicon oxide film;

FIGS. 12A through 12E are diagrams of experimental results showing a relationship between an etching and a rotational speed of the turntable when a concave-shaped pattern such as a via hole, a trench and the like are formed in a surface of a wafer;

FIGS. 14A through 14E are diagrams illustrating an example of steps in a first half of a method of processing a substrate according to an embodiment of the present invention; and FIGS. 15A through 15D are diagrams illustrating an example of steps in a second half of a method of processing a substrate according to an embodiment of the present invention.

DETAILED DESCRIPTION OF EMBODIMENTS

Figure 1:
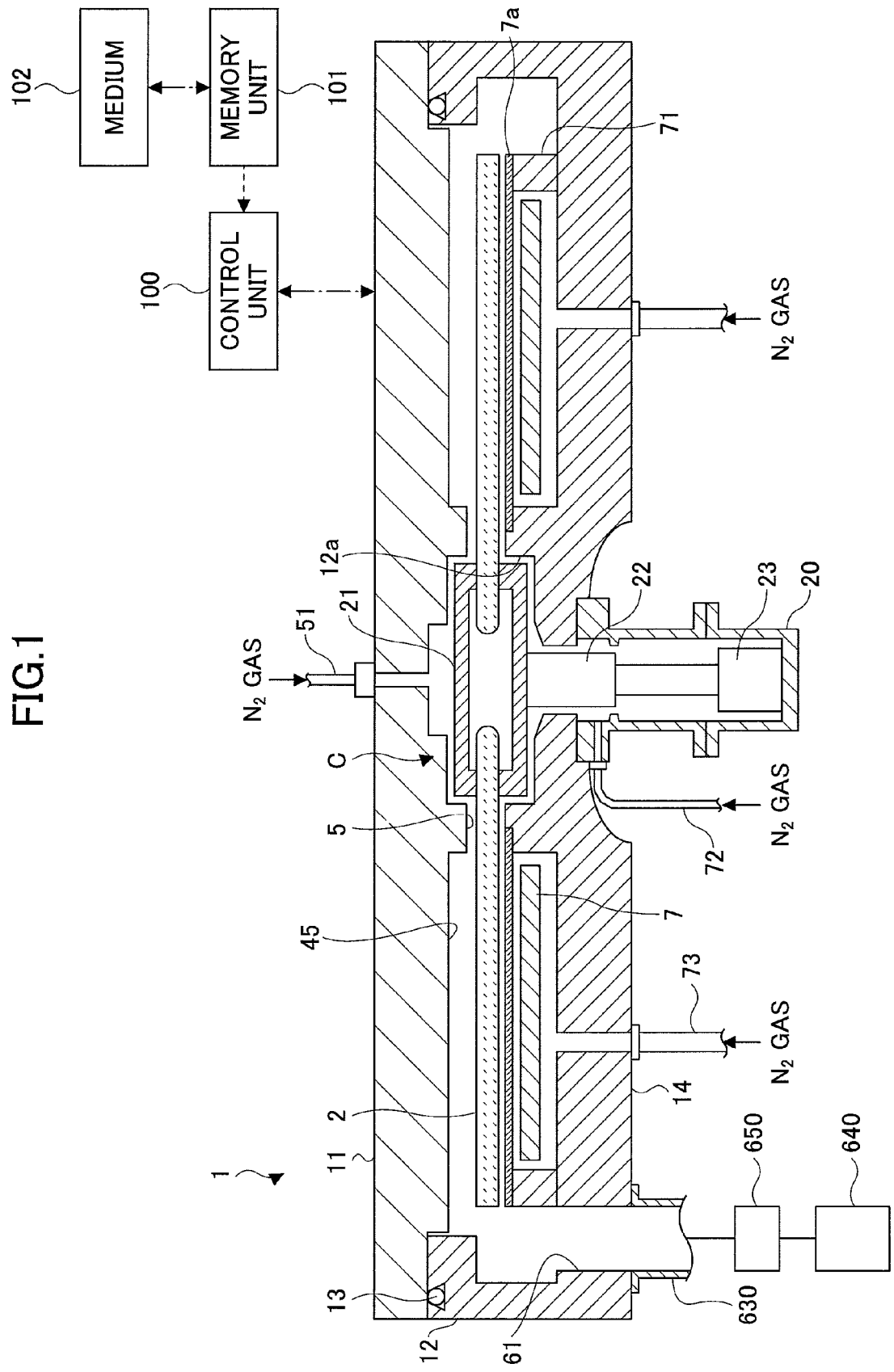
FIG. 1 is a cross-sectional view illustrating an example of a substrate processing apparatus according to an embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

[Substrate Processing Apparatus]

To begin with, a description is given below of a substrate processing apparatus according to an embodiment of the present invention.

Figure 2:
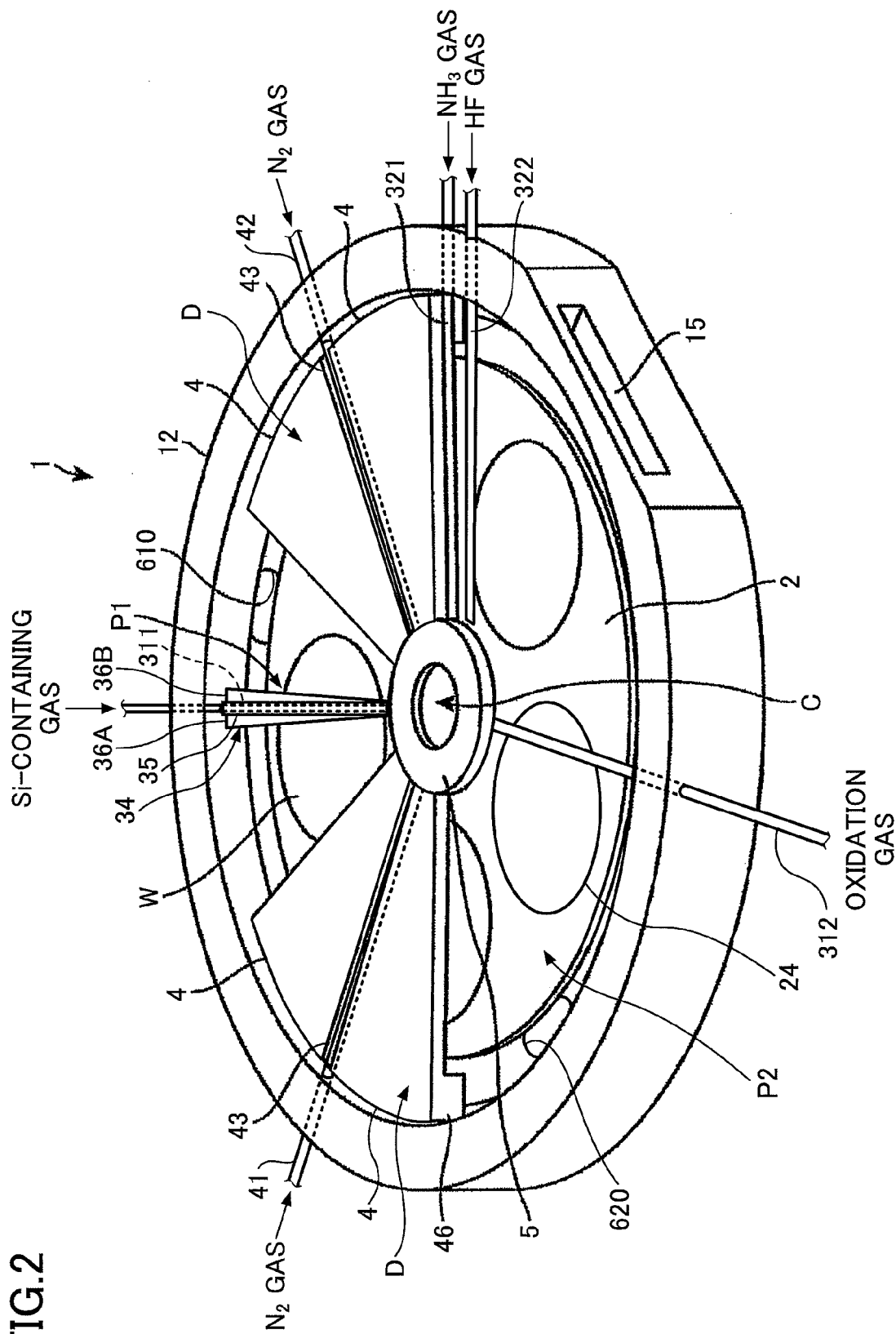
FIG. 2 is a perspective view illustrating an example of the substrate processing apparatus according to an embodiment of the present invention.
Figure 3:
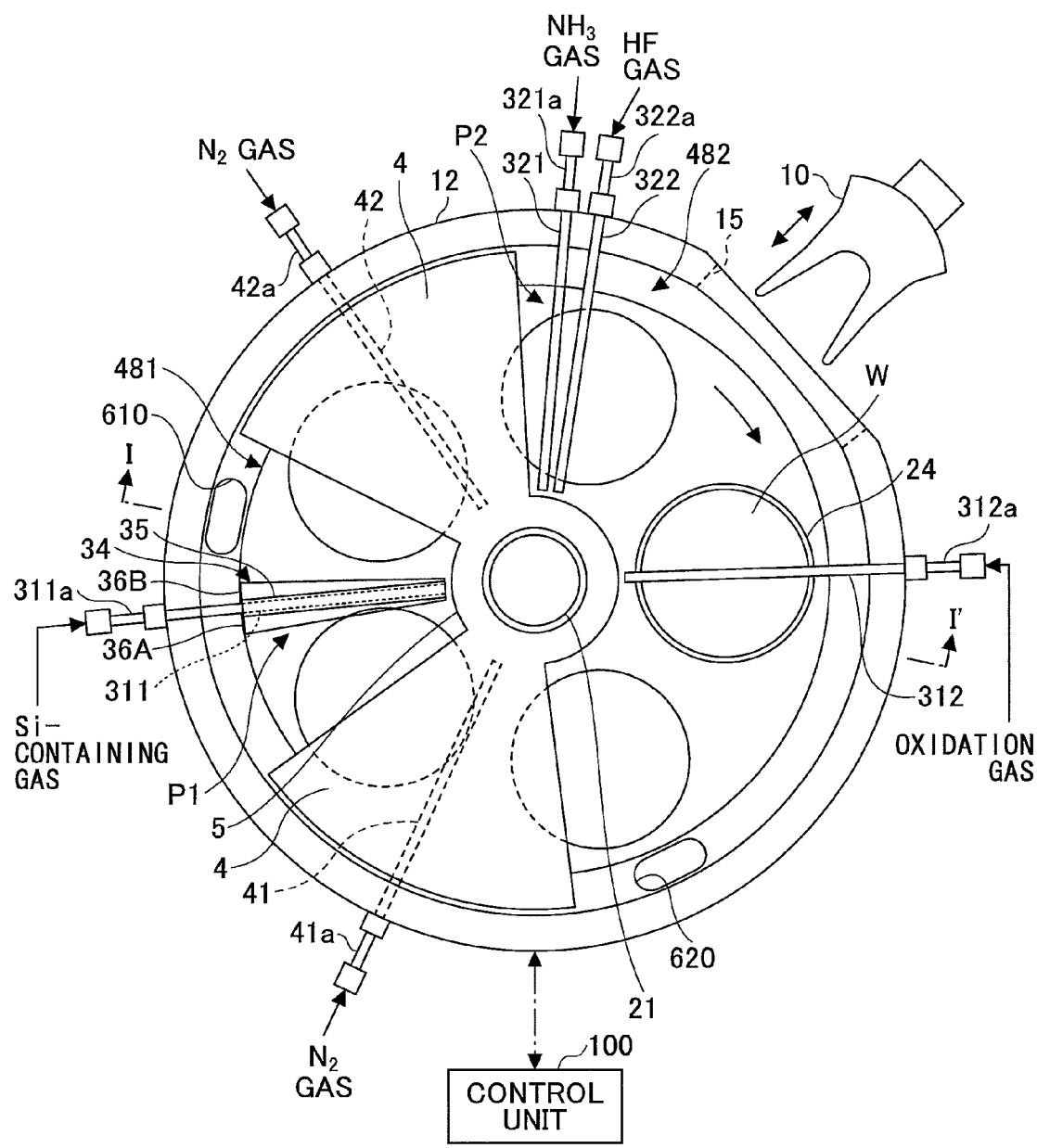
FIG. 3 is a schematic top view illustrating an example of the substrate processing apparatus according to an embodiment of the present invention.

FIG. 1 is a cross-sectional view of an example of a substrate processing apparatus of an embodiment. FIG. 2 is a perspective view of an example of the substrate processing apparatus of the embodiment. FIG. 3 is a schematic top view of an example of the substrate processing apparatus of the embodiment.

Referring to FIGS. 1 through 3, the substrate processing apparatus of the embodiment includes a vacuum chamber (or just a "chamber") 1 having a substantially circular shape in its plan view and a flattened shape in its side view, and a turntable 2 having its rotational center in the center of the chamber 1. The chamber 1 includes a chamber body 12 having a bottomed cylindrical shape, and a ceiling plate 11, which is detachably provided on the upper surface of the chamber body 12 through a sealing member 13 (see FIG. 1) such as an O-ring to hermetically seal the chamber 1.

The turntable 2 is fixed to a core portion 21 formed in a cylindrical shape at the center portion of the turntable 2. The core unit 21 is fixed to the upper end of a rotational shaft 22 extending in the vertical direction. The rotational shaft 22 penetrates through a bottom part 14 of the chamber 1. The lower end of the rotational shaft 22 is attached to a drive part 23, which causes the rotational shaft 22 (see FIG. 1) to rotate around the vertical axis of the rotational shaft 22. The rotational shaft 22 and the drive part 23 are accommodated in a cylindrical case body 20 whose upper surface is opened. A flange on the upper surface of the case body 20 is hermetically attached to the lower surface of a bottom part 14 of the chamber 1 to maintain an airtight state between the inner atmosphere and the outer atmosphere of the case body 20.

As illustrated in FIGS. 2 and 3, circular concave portions 24 for receiving a plurality of (five in the example of the drawings) semiconductor wafers (which is hereinafter referred to as "wafers") are formed in a surface of the turntable 2 along a rotational direction (a circumferential direction) of the turntable 2. FIG. 3 illustrates a single wafer W only in a single circular concave portion 24 for the sake of convenience. The inner diameter of the circular concave portion 24 is slightly greater than the diameter of the wafer W by, for example, 4 mm. The depth of the concave portion 24 is substantially equal to the thickness of the wafer W. Accordingly, when the wafer W is placed in the concave portion 24, the height of the surface of the wafer W is approximately the same as the height of the surface of the turntable in an area where the wafer is not placed.

FIGS. 2 and 3 are diagrams illustrating the structure inside the vacuum chamber 1. For the sake of convenience, the ceiling plate 11 is omitted from illustration in FIGS. 2 and 3. As illustrated in FIGS. 2 and 3, first and second film deposition gas nozzles 321 and 322, first and second etching gas nozzles 321 and 322, and separation gas nozzles 41 and 42, each of which is made of, for example, quartz, are arranged above the turntable 2. In the example of the drawings, the second film deposition nozzle 312, the separation gas nozzle 41, the first film deposition gas nozzle, the separation gas nozzle 42, and the first and second etching gas nozzles 321 and 322 are arranged in this order from a transfer opening 15 (which is described later) in a clockwise fashion (in the rotational direction of the turntable 2). Each of the nozzles 311, 312, 321, 322, 41 and 42 is introduced from an outer peripheral wall of the vacuum chamber 1 into the vacuum chamber through each gas introduction port 311a, 312a, 321a, 322a, 41a and 42a (see FIG. 3) that are fixed to an outer surface of the outer peripheral wall of the chamber body 12. Each of the nozzles 311, 312, 321, 322, 41 and 42 are attached to the chamber body 12 so as to extend along a radial direction of the chamber body 12 and in parallel with the surface of the turntable 2.

In a method of processing a substrate according to an embodiment, for example, a silicon-containing gas can be used as a first film deposition gas supplied from the first film deposition gas nozzle 311. Although a variety of silicon-containing gas can be used, for example, an LTO ((diisopropylamino)silane) gas may be used. An oxidation gas can be used as a second film deposition gas supplied from the second film deposition gas nozzle 312. For example, oxygen gas and/or ozone gas is preferred to be used as the oxidation gas. This allows a $SiO_2$ film to be deposited on the wafer W.

Moreover, ammonia gas may be used as the first etching gas supplied from the first etching gas nozzle 321, and hydrogen fluoride gas may be used as the second etching gas supplied form the second etching gas nozzle 322. To do this, as illustrated in FIGS. 2 and 3, two of the first and second etching gas nozzles 321 and 322 are arranged and configured to supply ammonia gas from the first gas nozzle 321 and fluoride hydrogen gas (HD) from the second etching gas nozzle 322. In this case, the first etching gas nozzle 321 is an etching gas nozzle for supplying ammonia gas, and the second etching gas nozzle 322 is an etching gas nozzle for supplying fluoride hydrogen gas. On this occasion, any of the etching gas nozzles 321 and 322 for supplying ammonia gas and fluoride hydrogen gas may be arranged upstream of the rotational direction of the turntable 2. In other words, the first etching gas nozzle 321 on the upstream side may supply fluoride hydrogen gas, and the second etching gas nozzle 322 on the downstream side may supply ammonia gas. In this manner, when providing two of the etching gas nozzle 321 and 322, the first etching gas nozzle 321 and the second etching gas nozzle 322 are preferred to be arranged adjacent to each other and in parallel to each other as illustrated in FIGS. 2 and 3. However, the arrangement of the first and second etching gas nozzles 321 and 322 is not limited to such a form. For example, the first and second gas nozzles 321 and 322 may be arranged apart from each other as long as the first and second etching gases can directly react with each other.

Moreover, by preliminarily mixing ammonia gas and fluoride hydrogen gas with each other, the first and second etching gas may be supplied from a single nozzle.

Furthermore, the etching gas etching methods can utilize a variety of gases and methods. For example, a high temperature etching may be performed by using a fluorine-containing gas such as $ClF_3$ and the like, or the etching may be performed by decomposing a fluorine-containing gas such as $NF_3$ and the like.

A first film deposition gas supply source containing the first film deposition gas is connected to the first film deposition gas nozzle 311 through an open/close valve and a flow controller (both of which are not shown in the drawing). Also, a second film deposition gas supply source containing the second film deposition gas is connected to the second film deposition gas nozzles 312 through open/close valves and flow controllers (both of which are not shown in the drawing). Similarly, first and second etching gas supply sources are connected to the first and second etching gas nozzles 321 and 322 through open/close valves and flow controllers (both of which are not shown in the drawing), respectively.

A variety of film deposition gases can be used as the first and second film deposition gases depending on a film to be deposited. In the embodiment, a description is given below of an example of depositing a silicon oxide film ($SiO_2$ film). In this case, a silicon-containing gas can be preferably used as the first gas. Although the silicon-containing gas is not limited to a specific gas, for example, an aminosilane-based gas such as 3DMAS (Tris(dimethylamino) silane $Si(N(CH_3)_2)_3H)$, 4DMAS (Tetrakis(dimethylamino) silane $Si(N(CH_3)_2)_4)$ (tetrachlorosilane $SiCl_4$), DCS (dichlorosilane $SiH_2Cl_2$) $SiH_4$ (monosilane), HCD (hexachlorodisilane $Si_2Cl_6$) or the like is preferably used as the first film deposition gas other than the above-mentioned LTO ((diisopropylamino) silane).

As described above, hydrogen gas and an oxidation gas are preferably used as the second film deposition gas, and oxygen gas and/or ozone gas are preferable used as the oxidation gas. The oxidation gas is preferred to contain ozone gas, by which a dense silicon oxide film can be particularly obtained.

In addition, the separation gas nozzles 41 and 42 are connected to a supply source (not illustrated) of a separation gas through a pipe arrangement, a flow controller, or the like (not illustrated). The separation gas may be an inert gas such as a noble gas of helium (He), Argon (Ar) or the like or an inert gas such as nitrogen ($N_2$) gas or the like. Although the inert gas is not limited to a particular gas and the noble gas, $N_2$ gas or the like can be used, and for example, $N_2$ gas can be preferably used. These inert gases are used as so-called a purge gas.

A plurality of gas discharge holes 33 opening toward the turntable 2 are arranged in the first and second film deposition gas nozzles 311 and 312 and the first and second etching gas nozzles 321 and 322 along the longitudinal directions of the first and second film deposition gas nozzles 311 and 312 and the first and second etching gas nozzles 321 and 322. Although the arrangement of the gas discharge holes 33 is not limited to a particular arrangement, for example, the gas discharge holes 33 can be arranged at an interval of, for example, 10 mm. In an area below the first film deposition gas nozzle 311, there is a first process area 21 used to cause the first film deposition gas to adsorb on the wafer W. An area below the first and second etching gas nozzles 321 and 322 and the second film deposition gas nozzle 312 is a second process area P2. Although the second process area P2 includes the second film deposition gas nozzle 312 and the first and second etching gas nozzles 321 and 322 together, when etching, the etching process can be performed in the second process area P2 by not supplying the second film deposition gas from the second film deposition gas nozzle 312, or supplying a purge gas such as a noble gas or N₂ gas from the second film deposition gas nozzle while supplying the first and second etching gases from the first and second etching gas nozzles 321 and 322, respectively. In this case, the first film deposition gas nozzle 311 does not supply the first film deposition gas, or supplies a purge gas such as an inert gas or N₂ gas in the first process area P1 in a similar fashion.

On the other hand, when depositing a film, the film deposition process can be performed in the first and second process areas P1 and P2 by not supplying an etching gas from the first and second etching gas nozzles 321 and 322, or supplying a purge gas such as a noble gas or N₂ gas while supplying the second film deposition gas from the second film deposition gas nozzle 312.

Furthermore, both of the film deposition process and the etching process can be performed during one revolution of the turntable 2 by rotating the turntable 2 in a counterclockwise fashion while supplying the first and second film deposition gases from the first and second film deposition gas nozzles 311 and 312 and supplying the first and second etching gas from the first and second etching gas nozzles 321 and 322 at the same time. Here, the turntable 2 is rotated in the counterclockwise fashion because the film deposition process has to be performed by causing the first film deposition gas made of a source gas such as the Si-containing gas and the like to adsorb on the wafer W and then supplying the second film deposition gas made of the oxidation gas so as to react with the source gas adsorbed on the wafer W. In other words, the turntable 2 has to be rotated so as to cause the first film deposition gas and the second film deposition gas supplied to the wafer W in this order. When the turntable 2 is rotated in the counterclockwise fashion, because the wafer W passes areas under areas under the second etching gas nozzle 322 and the first etching gas nozzle 321 after passing areas under the first film deposition gas nozzle 311 and the second film deposition gas nozzle 312 in this order, the cycle from the film deposition to the etching is repeated, which makes it possible to perform the film deposition and the etching in a short cycle.

Figure 4A:
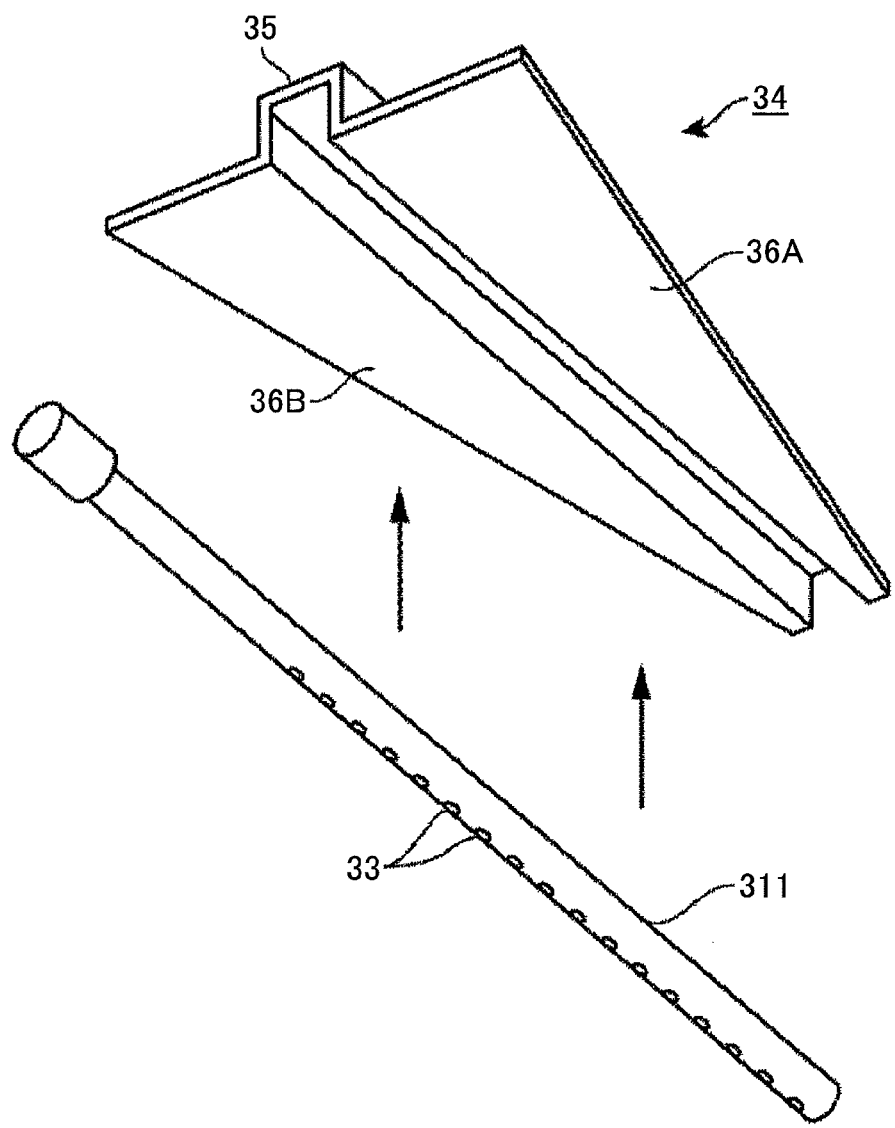
FIGS. 4A and 4B are configuration diagrams illustrating a gas nozzle and a nozzle cover of the substrate processing apparatus in FIG. 1.

As illustrated in FIGS. 2 and 3, a nozzle cover 34 is preferred to be provided at the first film deposition gas nozzle 311. A description is given below of the nozzle cover 34 with reference to FIGS. 4A and 4B. The nozzle cover 34 extends along a lengthwise direction of the first film deposition gas nozzle 31 and has a base part 35 having a convex cross-sectional shape. The base part 35 is arranged to cover the first film deposition gas nozzle 311. A current plate 36A is attached to a lower end of one side wall extending along the lengthwise direction of the base part 35 and a current plate 36B is attached to a lower end of the other side wall. In the embodiment, the current plates 36A and 36B are secured parallel to the upper surface of the turntable 2. Moreover, in the embodiment, as illustrated FIGS. 2 and 3, the current plate 36A is arranged on the upstream side of the first gas nozzle in the rotational direction of the turntable 2, and the current plate 36B is arranged on the downstream side.

Figure 4B:
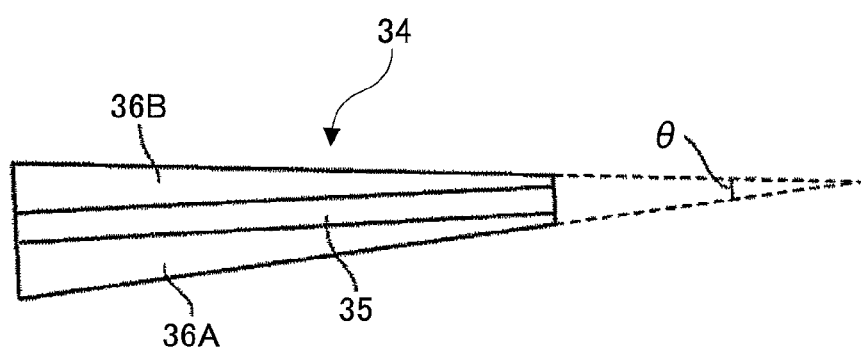

As clearly illustrated in FIG. 4B, the current plates 36A and 36B are symmetrically formed with respect to the central axis of the first gas nozzle 31. Moreover, a length of the current plates 36A and 36B along the rotational direction of the turntable 2 increases with decreasing distance to the outer periphery of the turntable 2, and therefore, the nozzle cover 34 has an approximately sectorial planar shape. Here, although an angle θ of the sector illustrated by a dashed line in FIG. 4B is determined by also considering a size of a convex portion 4 (separation area D) described later, for example, the angle is preferred to be in a range from 5 degrees to less than 90 degrees, and more specifically, is further preferred to be in a range from 8 degrees to less than 10 degrees.

Here, in the embodiment, an example of providing the nozzle cover 34 at only at the first film deposition gas nozzle 31 is illustrated, but a similar nozzle cover may be provided at the second etching gas nozzles 321 and 322.

Figure 5:
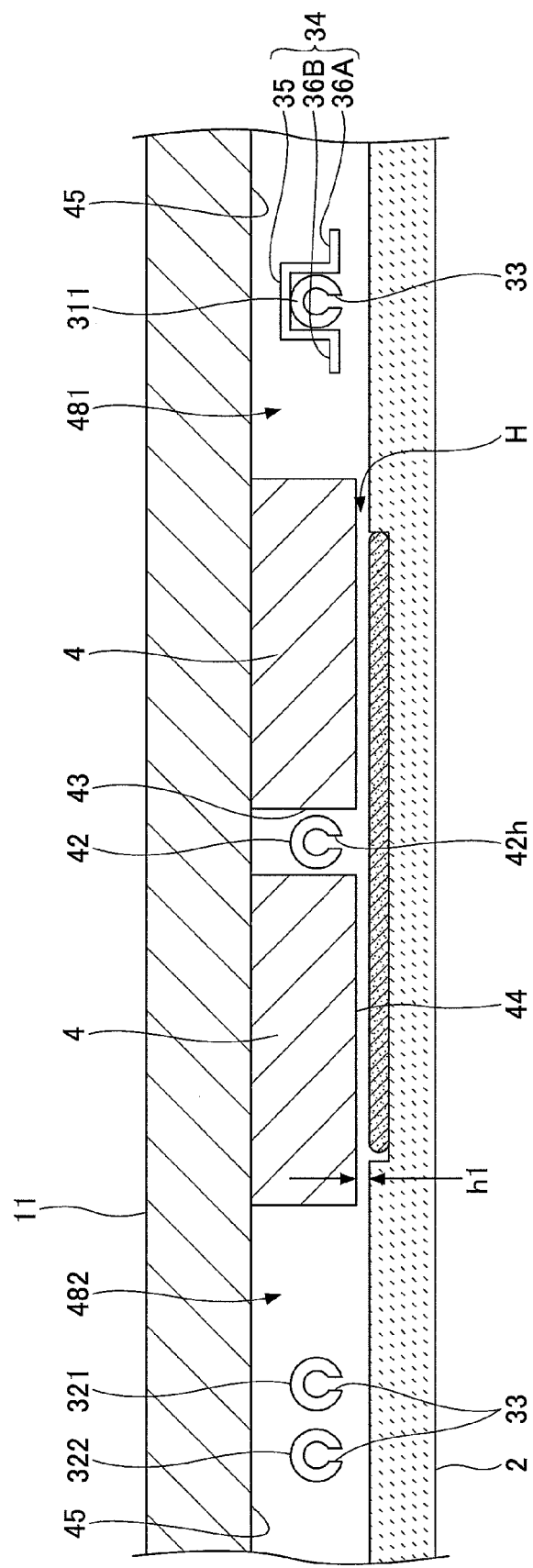
FIG. 5 is a partial cross-sectional view of an example of the substrate processing apparatus according to an embodiment of the present invention.

Referring to FIGS. 2 and 3, two convex portions 4 are provided inside the vacuum chamber 1. Each of the convex portions 4 has a substantially sectorial shape in its plan view with its apex cut in a circular arc shape. In this embodiment, an inner circular arc is connected to a ring-shaped protruding portion 5 (described later), and an outer circular arc is arranged along an inner peripheral surface of the chamber body 12 of the vacuum chamber 1. FIG. 5 illustrates a cross section of the vacuum chamber 1 along a concentric circle of the turntable 2 from the first film deposition gas nozzle 311 to the first and second etching gas nozzles 321 and 322. As illustrated in FIG. 5, the convex portion 4 is attached to the back surface of the ceiling plate 11. Accordingly, the vacuum chamber 1 includes a low ceiling surface 44 (a first ceiling surface), which is a lower surface of the convex portion 4, and a high ceiling surface 45 (a second ceiling surface), which is a surface higher than the low ceiling surface 44 and is positioned on both sides of the low ceiling surface 44 in a circumferential direction therein.

Furthermore, as illustrated in FIG. 5, a groove portion 43 is formed in the middle of the convex portion 4 in its circumferential direction so as to extend along a radial direction. The separation gas nozzle 42 is accommodated inside the groove portion 43. Another groove portion 43 is similarly formed in another convex portion 4. The separation gas nozzle 41 is accommodated in the other groove portion 43. As illustrated in FIG. 5, gas discharge holes 42h are formed in the separation gas nozzle 42. More specifically, the plurality of gas discharge holes 42h are formed along the longitudinal direction of the separation gas nozzle 42 at a predetermined interval (e.g., 10 mm). Moreover, an opening size of the gas discharge holes 42h can be set at, for example, 0.3 to 1.0 mm. Although not illustrated in the drawing, gas discharge holes 42h can be formed in the separation gas nozzle 41 similarly to the separation gas nozzle 42.

The first film deposition gas nozzle 311 and the first and second etching gas nozzles 321 and 322 are provided in spaces under the high ceiling surface 45. The first film deposition gas nozzle 311 and the first and second etching gas nozzles 321 and 322 are provided in the vicinity of the wafer W and apart from the ceiling surface 45. In addition, FIG. 5 illustrates a space 481 under the ceiling surface 45 where the first film deposition gas nozzle 311 is provided and a space 482 under the ceiling surface 45 where the first and second etching gas nozzles 321 and 322 and the second film deposition gas nozzle 312 are provided.

A separation space H, which is narrow, is formed between the low ceiling surface 44 and the turntable 2. When an inactive gas, for example, N₂ gas, is supplied from the separation gas nozzle 42, N₂ gas flows toward the spaces 481 and 482 through the separation space H. At this time, because the volume of the separation space H is smaller than the volumes of the spaces 481 and 482, the pressure of the separation space H can be set relatively higher than the pressures in the spaces 481 and 482 by N₂ gas. In other words, the separation space H provides a pressurized blocking wall having a high pressure between the spaces 481 and 482. Moreover, N₂ gas flowing from the separation space H to the spaces 481 and 482 functions as counter flows against a first gas from the first process area P1 and a second gas from the second process area P2. Accordingly, the first gas from the first process area P1 and the second gas from the second process area P2 are separated by the separation space H. Therefore, it is possible to prevent the first film deposition gas from the first process area 21 and the first and second etching and the second film deposition gas from the second process area P2 from mixing and reacting with each other inside the vacuum chamber 1.

Here, it is preferable to set the height h1 of the ceiling surface 44 relative to the upper surface of the turntable 2 suitable to make the pressure in the separation space H higher than the pressures in the spaces 481 and 482, considering the pressure inside the vacuum chamber 1 during the substrate process, the rotational speed of the turntable 2, the supply amount of the separation gas (the N₂ gas), or the like.

Thus, because the separation area D forming the separation space H can be said to be an area for supplying a purge gas to the wafer W, the separation area D can be referred to as a purge gas supply area D.

With reference to FIGS. 1 through 3 again, a ring-shaped protruding portion 5 surrounding the outer periphery of the core portion 21 holding the turntable 2, is provided under the lower surface of the ceiling plate 11. The ring-shaped protruding portion 5 is continuously formed from the convex portions 4 at portions on a side of the rotational center of the convex portions 4. The lower surface of the ring-shaped protruding portion 5 is formed to have substantially the same height as the lower surface of the ceiling surface 44.

FIG. 1 formerly referred to is a cross-sectional view taken along a line I-I' of FIG. 3, and illustrates an area where the ceiling surface 45 is provided. On the other hand, FIG. 6 is a partial cross-sectional view illustrating an area including the ceiling surface 44 of the substrate processing apparatus 1. As illustrated in FIG. 6, a bent portion 46 bent in a L-like shape so as to face the outer end surface of the turntable 2 can be formed in a peripheral edge portion (a portion of the vacuum chamber 1 on the outer edge side) of the convex portion 4 shaped into a substantially sectorial shape. The bent portion 46 can prevent gases from circulating between the spaces 481 and 482 (see FIG. 5) through a space between the turntable 2 and the inner periphery of the chamber body 12. The convex portion 4 shaped into the substantially sectorial shape is provided on the ceiling plate 11. Because the ceiling plate 11 is detachable from the chamber body 12, there is a small clearance between the outer peripheral surface of the bent portion 46 and the chamber body 12. A clearance between the inner peripheral surface of the bent portion 46 and the outer edge surface of the turntable 2 and a clearance between the outer peripheral surface of the bent portion 46 and the chamber body 12 are set to have a dimension similar to, for example, a height of the ceiling surface 44 relative to the upper surface of the turntable 2.

Referring to FIG. 3 again, a first evacuation opening 610 in communication with the space 481 and a second evacuation opening 620 in communication with the space 482 are formed between the turntable 2 and the inner periphery of the chamber body 12. As illustrated in FIG. 1, the first and second evacuation openings 610 and 620 are connected to, for example, a vacuum pump 640 that is an evacuating unit through exhaust pipes 630. FIG. 1 also illustrates a pressure control unit 650 provided in the exhaust pipe 630.

As illustrated in FIGS. 1 and 6, a heater unit 7 that is a heating means can be provided in a space between the turntable 2 and the bottom part 14 of the chamber 1, thereby heating the wafer W on the turntable 2 up to a temperature determined in a process recipe through the turntable 2. A ring-shaped cover member 71 is provided around the periphery and on the lower side of the turntable 2 to prevent the gas from intruding into a lower area under the turntable 2. As illustrated in FIG. 6, the cover member 71 can be configured to include an inner member 71a provided in a position vertically corresponding to the outer edge portion of the turntable 2 and to an outer peripheral side outside the outer edge portion of the turntable 2, and an outer member 71b provided between the inner member 71a and the inner wall surface of the vacuum chamber 1. The outer member 71b is provided in the vicinity of the bent portion 46 formed on the outer edge portion of the convex portion 4 in the separation areas D under the bent portions 46. The inner member 71a surrounds the entire periphery of the heater unit 7 and is positioned under the outer edge portion of the turntable 2 and a portion slightly outside the outer edge portion.

As illustrated in FIG. 1, a part of the bottom part 14 closer to the rotation center than the space where the heater unit 7 is arranged has the ring-shaped protruding portion 12a protruding upward so as to approach the core portion 21 provided on the lower surface of the turntable 2 and in the vicinity of the center portion of the turntable 2. A narrow space is provided between the ring-shaped protruding portion 12a and the core portion 21. A clearance between the inner peripheral surface of a through-hole for the rotational shaft 22 penetrating through the bottom part 14 and the rotational shaft 22 is small. The narrow space and the small clearance communicate with the inside of the case body 20. A purge gas supply pipe 72 is provided in the case body 20 so that N₂ gas that is the purge gas is supplied into the narrow space to purge the narrow space. In the bottom part 14 of the chamber 1, a plurality of purge gas supply pipes 73 are provided under the heater unit 7 at intervals of a predetermined angle in the circumferential direction (only one purge gas supply pipe 73 is illustrated in FIG. 6) to purge a space where the heater unit 7 is arranged. Furthermore, a lid member 7a is provided between the heater unit 7 and the turntable 2 to bridge and cover a clearance between the inner peripheral wall of the outer member 71b (the upper surface of the inner member 71a) and the upper end portion of the ring-shaped protruding portion 12a along the circumferential direction in order to prevent the gas from intruding into an area in which the heater unit 7 is provided. The lid member 7a can be made of, for example, quartz.

When N₂ gas is supplied from the purge gas supply pipe 72, N₂ gas flows through a space between the turntable 2 and the lid member 7a by way of a clearance between the inner periphery of the through-hole and the rotational shaft 22 and a clearance between the protruding portion 12a and the core portion 21, and is evacuated from the first evacuation opening 610 or the second evacuation opening 620 (see FIG. 3). Moreover, when N₂ gas is supplied from the purge gas supply pipes 73, N₂ gas flows out of the space in which the heater unit 7 is accommodated through a clearance between the lid member 7a and the inner member 71a (not illustrated in the drawing), and is evacuated from the first evacuation opening 610 or the second evacuation opening 620 (see FIG. 3). The flow of N₂ gas can prevent the gases in the space 481 and the space 482 mixing with each other through a space on the central and lower side of the vacuum chamber 1 and a space below the turntable 2.

Moreover, a separation gas supply tube 51 is connected to a center portion of the ceiling plate 11 of the vacuum chamber 1 so as to supply the separation gas of N₂ gas to a space 52 between the ceiling plate 11 and the core portion 21. The separation gas supplied to the space 52 is discharged toward the periphery of the turntable 2 along the surface on the side of a wafer receiving area (circular concave portion 24) of the turntable 2 through a narrow clearance 50 (see FIG. 6) between the ring-shaped protruding portion 5 and the turntable 2. The space 50 is maintained to have a pressure higher than the pressures of the spaces 481 and 482 by the separation gas. Therefore, the space 50 prevents the first film deposition gas supplied to the first process area P1 and the first and second etching gases and the second film deposition gas supplied to the second process area P2 from being mixed with each other after passing through the center area C. That is to say, the space 50 (or the center area C) functions in a manner similar to the separation space H (or the separation area D).

Furthermore, as illustrated in FIGS. 2 and 3, a transfer opening 15 can be formed in the side wall of the vacuum chamber 1 for transferring the wafer W, which is the substrate, between a transfer arm 10 provided outside the vacuum chamber 1 and the turntable 2. The transfer opening 15 is opened and closed by a gate valve (not illustrated in the drawing). In this case, the wafer W is transferred between the circular concave portion 24 that is the wafer receiving area of the turntable 2 and the transfer arm 10 at a position facing the transfer opening 15. For this purpose, lift pins (not illustrated in the drawing) for lifting the wafer W from the back surface side to serve and receive the wafer W and a lifting mechanism (not illustrated in the drawing) for lifting the lift pins (not illustrated in the drawing) can be provided at a portion of the turntable 2 corresponding to the position where the wafer W is served and received. The lift pins penetrate through the circular concave portion 24 of the turntable 2.

Moreover, as illustrated in FIG. 1, the substrate processing apparatus according to the embodiment may include a control unit 100 constituted of a computer for controlling operations of the entire substrate processing apparatus. A program to be executed by the substrate processing apparatus under control of the control unit 100 can be stored in a memory of the control unit 100. This program includes groups of steps for performing the method of depositing the film as described below and is stored in a medium 102 such as a hard disk, a compact disk, a magnetic optical disk, a memory card, a flexible disk, or the like. The program is read in a memory unit 101 by a predetermined reading device and can be installed inside the control unit 100.

[Method of Processing Substrate]

Next, a description is given below of a method of processing a substrate according to an embodiment of the present invention. Although the method of processing the substrate of the embodiment can be applied to a variety of films, a description is given below of a method of processing a substrate related to an etching and a film deposition of a silicon oxide film. A description of components described already is omitted by using the same numerals as the components in the substrate processing apparatus of the embodiment discussed above.

To begin with, a thermal etching of a silicon oxide film is performed by generation of reactions as shown by chemical reaction formulas (1) through (3).

$$HF + NH_3 \rightarrow (NH_4)F \quad (1)$$

$$SiO_2(NH_4)F \rightarrow H_2O + (NH_4)_2SiF_6 \quad (2)$$

$$(NH_4)_2SiF_6 + heat \rightarrow SiF_4 + 2NH_3 + 2HF \quad (3)$$

When etching the SiO₂ film, because SiO₂ and HF do not react with each other, the SiO₂ etching is performed by adding ammonia to HF to produce ammonium fluoride. Hence, in the method of processing the substrate of the embodiment, the first etching gas nozzle 321 supplies ammonia, and the second etching gas nozzle 322 supplies fluoride hydrogen.

The method of processing the substrate according to the embodiments of the present invention is invented based on findings obtained by experiments including a variety of simulations. Because understanding the findings at first serves to understand the embodiments easily, to begin with, a description is given below of the experimental results including the variety of simulations.

FIG. 7 is a simulation diagram illustrating a volume concentration of N₂ in the vacuum chamber 1 when supplying N₂ gas from the separation gas nozzles 41 and 42 while supplying the first and second etching gases from the first and second etching gas nozzles 321 and 322, respectively.

The simulation conditions are as follows: a pressure in the vacuum chamber 1 is 8 Torr; a temperature of the turntable 2 is 150 degrees C.; N₂ gas is supplied from the separation gas supply pipe 51 located near the axis at a flow rate of 1 slm; N₂ gas is supplied from the separation gas nozzles 41 and 42 facing the turntable 2 and the first film deposition gas nozzle 311 at a flow rate of 5 slm; HF gas is supplied from the second etching gas nozzle 322 at a flow rate of 200 sccm; and NH₃ gas is supplied from the first etching gas nozzle 321 at a flow rate of 600 sccm. Under the conditions, a volume concentration of N₂ gas inside the vacuum chamber 1 is simulated at each rotational speed by changing the rotational speed of the turntable 2 into 20, 120, and 240 rpm.

FIG. 7A is a diagram showing a simulation result when the rotational speed of the turntable 2 is set at 20 rpm. FIG. 7B is a diagram showing a simulation result when the rotational speed of the turntable 2 is set at 120 rpm. FIG. 7C is a diagram showing a simulation result when the rotational speed of the turntable 2 is set at 240 rpm.

In FIGS. 7A through 7C, the volume concentration of N₂ is the highest in a region Q, higher in a region R than in a region S, and higher in the region S than in a region O.

Comparing all of FIGS. 7A through 7C with each other, in the second process area P2 where N₂ gas is not supplied but the first and second etching gases are supplied, an area of the regions Q and R is larger in FIG. 7B than in FIG. 7A, and is the largest in FIG. 7C. In other words, the volume concentration of N₂ gas increases as the rotational speed of the turntable 2 increases. This means that an inflow of N₂ gas from the separation area D increases as the rotational speed of the turntable 2 increases. In other words, the faster the turntable 2 rotates, the more N₂ gas flows out of the separation area D along with the rotation of the turntable 2. Accordingly, the higher the rotational speed of the turntable 2 becomes, the smaller the volume concentration of the first and second etching gases in the second process area P2 becomes and the greater the volume concentration of N₂ gas becomes.

Figure 8C:
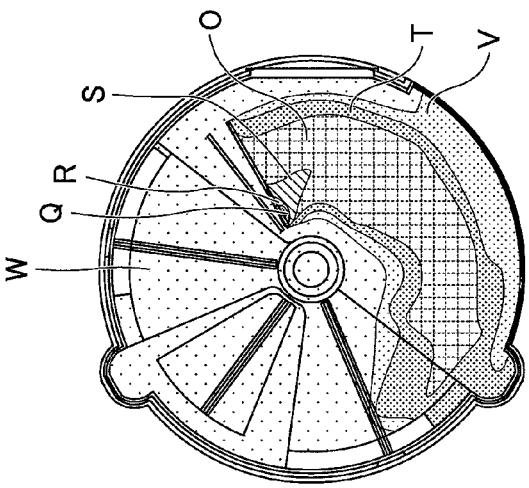
FIGS. 8A through 8C are simulation diagrams illustrating volume concentrations of HF of a second process area P2 under conditions similar to FIGS. 7A through 7C.
Figure 8B:
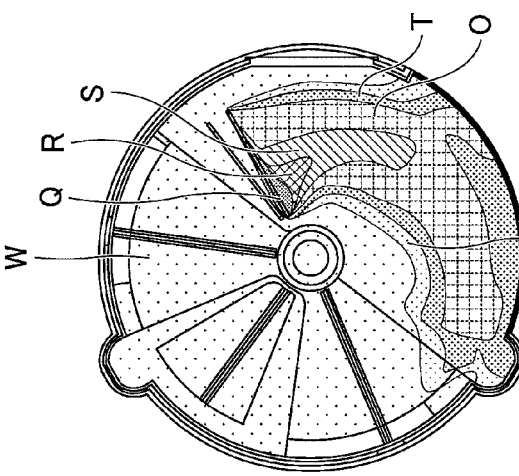
Figure 8A:
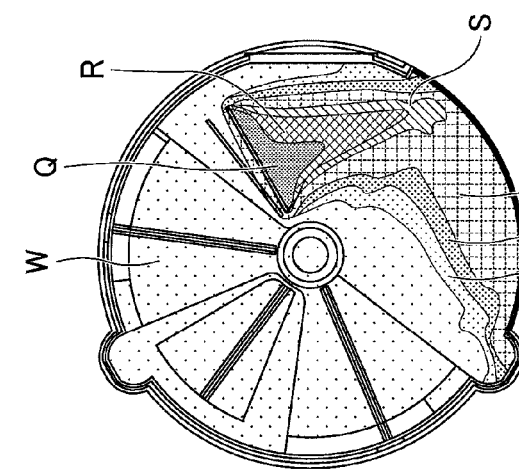

FIGS. 8A through 8C are diagrams showing simulation results of a volume concentration of HF gas in the second process area P2 under conditions similar to FIGS. 7A through 7C. FIG. 8A is a diagram showing a simulation result when the rotational speed of the turntable 2 is set at 20 rpm similar to FIG. 7A. FIG. 8B is a diagram showing a simulation result when the rotational speed of the turntable 2 is set at 120 rpm. FIG. 8C is a diagram showing a simulation result when the rotational speed of the turntable 2 is set at 240 rpm.

In FIGS. 8A through 8C, the volume concentration of HF is classified into seven levels of regions Q through W. The region Q has the highest volume concentration of HF, and the volume concentration of HF decreases in sequence. The region W has the lowest volume concentration of HF.

Comparing all of FIG. 8A through 8C with each other, an area of the regions T through W having low volume concentrations increases as the rotational speed of the turntable 2 increases, and the volume concentration of HF becomes the lowest when the rotational speed of the turntable 2 is 240 rpm (see FIG. 8C).

FIGS. 9A through 9C are diagrams showing simulation results of a volume concentration of $NH_3$ in the second process area P2 under conditions similar to FIGS. 7A through 7C and FIGS. 8A through 8C. FIG. 9A is a diagram showing a simulation result when the rotational speed of the turntable 2 is set at 20 rpm; FIG. 9B is a diagram showing a simulation result when the rotational speed of the turntable 2 is set at 120 rpm; and FIG. 9C is a diagram showing a simulation result when the rotational speed of the turntable 2 is set at 240 rpm similar to FIGS. 7A through 7C and FIGS. 8A through 8C.

Even in FIGS. 9A through 9C, similar to FIGS. 8A through 8C, the volume concentration of $NH_3$ is classified into seven levels of regions Q through W, and the region Q has the highest volume concentration of HF. The volume concentrations of HF of the regions R though V decrease in sequence, and the region W has the lowest volume concentration of HF.

Comparing all of FIGS. 9A through 9C with each other, the faster the rotational speed of the turntable, the more an area of the regions T through W having low volume concentrations of $NH_3$ increases, and the volume concentration of $NH_3$ is the lowest when the rotational speed is set at 240 rpm.

As illustrated in FIGS. 7A through 9C, the higher the rotational speed of the turntable 2, the lower the volume concentrations of the first and second etching gases ($NH_3$ and HF) in the second process area P2 for etching becomes and the higher the volume concentration of $N_2$ gas. As a result, although an etching rate decreases as the rotational speed of the turntable 2 increases, because a percentage of $N_2$ gas increases, the etching in itself is inferred to become gentle.

Figure 10:
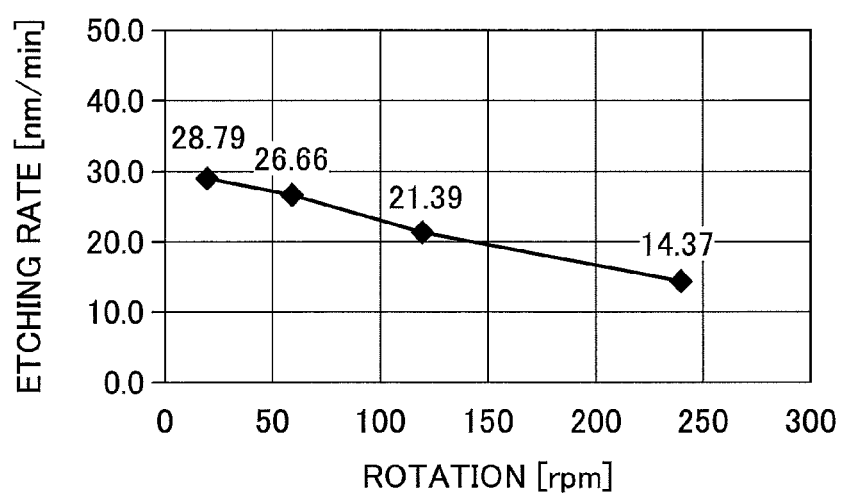
FIG. 10 shows an experimental result when examining rotational speed dependency of the etching step performed in a method of processing a substrate according to an embodiment of the present invention.

FIG. 10 is an experimental result of having examined rotational speed dependency of an etching process performed in the method of processing the substrate according to the embodiment of the present invention. More specifically, FIG. 10 is an experimental result of having examined a relationship between the rotational speed of the turntable 2 and the etching rate.

The etching was performed on a $SiO_2$ film deposited on a flat area in a surface of a wafer W. A temperature of the turntable 2 was set at 200 degrees C., and a pressure in the vacuum chamber 1 was set at 8 Torr. A flow rate of HF gas was set at 200 sccm, and a flow rate of $NH_3$ was set at 600 sccm.

In FIG. 10, the horizontal axis indicates a rotational speed (rpm) of the turntable 2, and the vertical axis indicates an etching rate (nm/min). As shown in FIG. 10, the etching rate was 28.79 nm/min when the rotational speed of the turntable 2 was 20 rpm, 26.66 nm/min when the rotational speed of the turntable 2 was 60 rpm, 21.39 nm/min when the rotational speed of the turntable 2 was 120 rpm, and 14.37 nm/min when the rotational speed of the turntable 2 was 240 rpm. The result showed that the etching rate was higher as the rotational speed of the turntable 2 was lower and that the etching rate decreased as the rotational speed of the turntable 2 increased.

In this manner, the experimental result shown in FIG. 10 indicates that the etching rate increases when decreasing the rotational speed of the turntable 2 and that the etching rate decreases when increasing the rotational speed of the turntable 2.

FIGS. 11A through 11F are views showing a result of an experiment performed for examining a relationship between a rotational speed of the turntable 2 and a surface roughness of a silicon oxide film after being etched.

The experiment in FIGS. 11A through 11F was performed under conditions as follows: a temperature of the turntable 2 was 150 degrees C.; a pressure in the vacuum chamber 1 was 8 Torr; a flow rate of HF gas was 200 sccm; a flow rate of $NH_3$ gas was 600 sccm; and the etching time was 600 sccm.

FIGS. 11A through 11D are SEM (Scanning Electron Microscopy) images showing surfaces of films after being etched when the turntable 2 was set at 20, 60, 120 and 240 rpm, respectively. FIG. 11E is a SEM image showing a surface of a film before being etched. FIG. 11F is a graph showing quantities of etching for each rotational speed.

As illustrated in FIGS. 11A through 11D, the higher the rotational speed of the turntable 2 becomes, the smoother the surfaces of the films after etched becomes and the smaller the surface roughness becomes. This is thought to be for the reason that a period of time when the film is exposed to the etching gas for one revolution of the turntable 2 becomes shorter as the rotational speed becomes higher and a quantity of etching reaction becomes small. In other words, the etching with a small etching quantity per once is repeated many times, which makes it possible to perform a finer etching process.

Thus, when the surface roughness of the etched film is desired to be decreased, etching while setting the rotational speed of the turntable 2 at a high speed is effective.

FIGS. 12A through 12E are experimental results of showing a relationship between an etching and a rotational speed of the turntable when a concave-shaped pattern such as a via hole, a trench and the like are formed in a surface of a wafer W. In the experiment shown in FIGS. 12A through 12E, the concave-shaped pattern such as the via hole, the trench and the like are formed in the surface of the wafer W, and the etching was performed after depositing a film shaped into a concave shape in the concave-shaped pattern along the concave-shaped pattern.

FIG. 12A is a diagram illustrating a state of a film-deposited via hole before etching, and FIG. 12B is a diagram illustrating a state of a via hole after the etching when the rotational speed of the turntable is set at 20 rpm. Similarly, FIG. 12C is a diagram illustrating a state of a via hole after the etching when the rotational speed of the turntable is set at 60 rpm, and FIG. 12D is a diagram illustrating a state of a via hole after the etching when the rotational speed of the turntable is set at 120 rpm. FIG. 12E is a diagram illustrating a state of a via hole after the etching when the rotational speed of the turntable is set at 240 rpm.

In the experiment of FIGS. 12A through 12E, a temperature of the turntable 2 was set at 150 degrees C., and a pressure of the vacuum chamber 1 was set at 8 Torr. A flow rate of HF gas was set at 200 sccm, and a flow rate of $NH_3$ gas was set at 600 sccm. Rotational speeds of the turntable 2 were set at 20 rpm, 60 rpm, 120 rpm and 240 rpm, and quantities of thermal etchings after performing the etchings for one minute were measured with respect to regions divided in a depth direction of the via holes. The via holes were 8 nm thick, and divided into 2 nm in the depth direction. Among the divided via holes, each of the top surfaces and the top side surfaces were referred to as "TOP & T-Side"; the next 2 nm were referred to as "T-M"; the next 2 nm in the middle was referred to as "MID"; the next 2 nm on the bottom side was referred to as "M-B", and the bottom 2 nm was referred to as "BTM".

To begin with, as illustrated in FIG. 12A, a $SiO_2$ film having 38 nm thick was deposited in the via hole formed in a concave shape along the concave shape of the via hole.

As illustrated in FIG. 12B, after etching the $SiO_2$ film while rotating the turntable 2 at a rotational speed of 20 rpm for one minute, the thickness of the remaining films were 3-9 nm thick in the "TOP", and 4-6 nm in the "T-Side." On the other hand, the film thickness of the remaining film after the etching was 30-31 nm in the "BTM." The quantity of etching in the "TOP & T-Side" (top end portion) was greater than the quantity of etching in the "BTM" (bottom portion), and the film in the via hole was etched to have an approximately V shape as a whole.

Moreover, as illustrated in FIG. 12C, after etching the $SiO_2$ film while rotating the turntable 2 at a rotational speed of 60 rpm for one minute, the thickness of the remaining film was 3-8 nm in the TPO, and 6-10 nm in the T-Side. In contrast, the film thickness of the remaining film after the etching was 30-31 nm in the "BTM." The quantity of etching in the "TOP & T-Side" (top end portion) was greater than the quantity of etching in the "BTM" (bottom portion), and the film in the via hole was etched to have an approximately V shape as a whole although the V shape has the difference between the top end portion and the bottom portion smaller than that in FIG. 12B.

Furthermore, as illustrated in FIG. 12D, after etching the $SiO_2$ film while rotating the turntable 2 at a rotational speed of 120 rpm for one minute, the thickness of the remaining film was 11-17 nm in the "TPO", and 12-13 nm in the "T-Side." In contrast, the film thickness of the remaining film after the etching was 29-30 nm in the "BTM." Although the quantity of etching in the "TOP & T-Side" (top end portion) was greater than the quantity of etching in the "BTM" (bottom portion), the difference between the top end portion and the bottom portion was smaller than that in FIG. 12B, and the film in the via hole was etched to have a shape closer to a straight (vertical) concave shape rather than the V shape as a whole.

Here, the rotational speed of the turntable 2 of 120 rpm is generally used during a film deposition process.

In addition, as illustrated in FIG. 12E, after etching the $SiO_2$ film while rotating the turntable 2 at a rotational speed of 240 rpm for one minute, the thickness of the remaining film was 25-26 nm in the TPO, and 29 nm in the T-Side. In contrast, the film thickness of the remaining film after the etching was 30-33 nm in the "BTM." The quantity of etching in the "TOP & T-Side" (top end portion) was not very different from the quantity of etching in the "BTM" (bottom portion), and the film in the via hole was etched to have a shape closer to a straight (vertical) concave shape as a whole.

Thus, the experimental results shown in FIGS. 12A through 12E indicates that a film deposited in a concave-shaped pattern is likely to be etched so as to have a V shape when setting a rotational speed of the turntable 2 at a low speed, and the film deposited in the concave-shaped pattern is likely to be etched so as to have a shape along the concave-shaped pattern when setting the rotational speed of the turntable 2 at a high speed.

Figure 13:
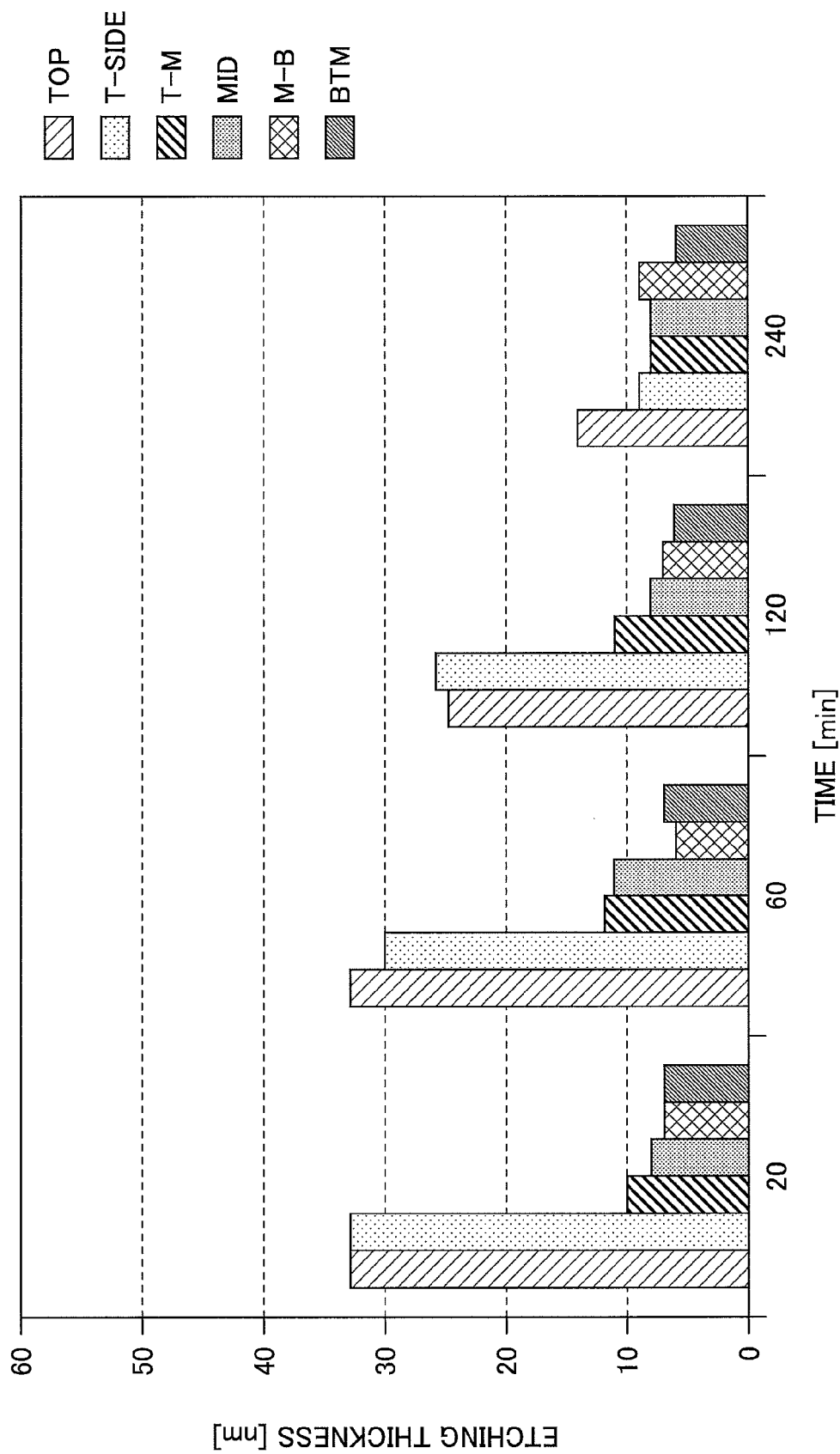
FIG. 13 is a graph showing the experimental results of FIG. 12 by a value of an amount of etching for each via hole position.

FIG. 13 is a graph showing the experimental results shown in FIGS. 12A through 12E with respect to quantities of etching (nm) of depth positions for each via hole with numerical values. FIG. 13 indicates that the quantities of etching of the TOP and the T-side were greater than the other locations and that the film was etched to have a V shape when the rotational speed of the turntable 2 was 20 rpm. In contrast, it is noted that the film was etched to have a concave-like shape along the concave shape of the via hole because all of the positions have approximately the same etching rates including the TOP and the T-side when the rotational speed was 240 rpm. When the rotational speeds were 60 rpm and 120 rpm, FIG. 13 indicates intermediate states therebetween, respectively.

Hence, the experimental results in FIGS. 12A through 12E and FIG. 13 indicate that an etching just has to be performed while setting a rotational speed of the turntable 2 at a low speed when a film deposited in a concave-shaped pattern is desired to be etched into a V shape, and that the etching just has to be performed while setting the rotational speed of the turntable 2 at a high speed when the film deposited in the concave-shaped pattern is desired to be etched into a concave shape along the concave-shaped pattern while reducing the surface roughness of the film.

A description is given below of a method of processing a substrate for performing an etching while controlling a rotational speed of the turntable 2 according to an embodiment of the present invention based on the above-discussed experimental results.

FIGS. 14A through 14E are diagrams illustrating an example of steps in a first half of the method of processing the substrate according to the embodiment of the present invention. FIGS. 14A through 14E illustrate steps of depositing a silicon oxide film in a concave-shaped pattern formed in a surface of a wafer W and then etching the silicon oxide film in the concave-shaped pattern into a shape having a cross section of a V shape.

A description is given below of the method of processing the substrate of the embodiment from a step of carrying a wafer W therein along with the practical substrate processing operation with reference to FIGS. 14A through 14E and FIGS. 1 through 6 in addition thereto.

To begin with, as illustrated in FIGS. 2 and 3, a gate valve (not illustrated in the drawing) is opened, and the wafer W is transferred into the circular concave portion 24 of the turntable 2 through the transfer opening 15 from the outside by the transfer arm 10. The transfer of the wafer W is performed by causing the not illustrated lift pins to move up and down from the bottom side of the vacuum chamber 1 through the through-holes formed in the bottom surface of the circular concave portion 24 when the circular concave portion 24 stops at a position facing the transfer opening 15. Such transfer of the wafer W is performed by intermittently rotating the turntable 2, and the wafers W are placed on five of the circular concave portions 24 of the turntable 2, respectively.

Subsequently, the gate valve is closed, and after the vacuum pump 640 evacuates the vacuum chamber 1 up to a predetermined degree of vacuum and while continuing to evacuate the vacuum chamber 1, $N_2$ gas of the separation gas is discharged at a predetermined flow rate from the separation gas nozzles 41 and 42. Moreover, $N_2$ gas is also discharged from the separation gas supply pipe 51 and the purge gas supply pipes 72 and 73 at a predetermined flow rate. Following this, the pressure control unit 650 (see FIG. 1) adjusts the pressure in the vacuum chamber 1 to a preset process pressure. Next, the wafer W is heated up to a temperature of, for example, 450 degrees C. by the heater unit 7 while rotating the turntable 2 in a clockwise direction at a rotational speed of, for example, 120 rpm.

Next, a film deposition process is performed. In the film deposition process, the first film deposition gas nozzle 311 supplies a Si-containing gas, and the second film deposition gas nozzle 312 supplies an oxidation gas. The first etching gas nozzle 321 and the second etching gas nozzle 322 supply $N_2$ gas as a purge gas or do not supply any gas. Here, although a variety of gases is available for the Si-containing gas, a description is given below of an example of using LTO ((diisopropylamino) silane) as the Si-containing gas in the embodiment. Also, although a variety of gases is available for the oxidation gas, an example of using oxygen gas is described below in this embodiment.

When the wafer W passes the first process area P1, LTO of a source gas is supplied from the first film deposition gas nozzle 311 and adsorbs on a surface of the wafer W. The wafer W including LTO adsorbed thereon enters the second process area P2 after being purged by passing the separation area D including the separation gas nozzle 42 due to the rotation of the turntable 2. In the second process area P2, the second film deposition gas nozzle 312 supplies oxygen gas, which oxidizes Si component contained in LTO, and $SiO_2$ of a reaction product deposits on the surface of the wafer W. The wafer W having passed the second process area P2 enters the first process area P1 after being purged by passing the separation area D including the separation gas nozzle 41. In the first process area P1, the first film deposition gas nozzle 311 supplies LTO, and LTO adsorbs on the surface of the wafer W. After that, by repeating similar cycles, $SiO_2$ of the reaction product deposits on the surface of the wafer W, and a $SiO_2$ film is deposited thereon.

After the $SiO_2$ film is deposited up to a predetermined film thickness, as necessary, a modification process may be performed on the $SiO_2$ film by stopping the supply of LTO from the first film deposition gas nozzle 311 and continuing to supply oxygen gas from the second film deposition gas nozzle 312 while continuing to rotate the turntable 2.

FIG. 14A is a diagram illustrating an example of a first film deposition process of the method of processing the substrate according to the embodiment of the present invention.

As illustrated in FIG. 1A, a silicon oxide film 90 is deposited in a via hole 80 that is one of the concave-shaped patterns by performing the first film deposition process. As illustrated in FIG. 14A, the silicon oxide film 90 formed in the via hole 80 at first has a cross-sectional shape along a concave shape of the concave-shaped pattern.

FIG. 14B is a diagram illustrating an example of a first etching process of the method of processing the substrate according to the embodiment of the present invention. In the first etching process, the silicon oxide film 90 is etched so as to have a cross section of a V shape. More specifically, the first etching process is performed as follows.

The first and second film deposition gas nozzles 311 and 312 illustrated in FIGS. 2 and 3 stop supplying LTO and oxygen gas, respectively, and do not supply any gas or supply $N_2$ gas as a purge gas instead. The turntable 2 is set at a temperature appropriate for a thermal etching, for example, about 150 degrees C. A rotational speed of the turntable 2 is set at a low rotational speed in a range of 20 to 60 rpm, for example, at 20 rpm. In this state, the first etching gas nozzle 321 supplies $NH_3$ gas, and the second etching gas nozzle 322 supplies HF gas, thereby starting an etching process. $NH_3$ and HF react with each other as shown by the chemical reaction formula (1) and becomes ammonium fluoride, and the thermal decomposition occurs as shown by the chemical reaction formulas (2) and (3), thereby etching the silicon oxide film 90. At this time, because the turntable 2 rotates at the low speed of 20 rpm, as described in FIGS. 12A through 12E and 13, the silicon oxide film 90 is etched so as to have a cross section of a V shape. By etching the silicon oxide film 90 in the via hole 80 into the V shape, a hole having a large opening at the top end can be formed in the silicon oxide film 90, and the hole can be filled with a silicon oxide film 90 up to the bottom in the next film deposition, thereby performing the film deposition process with high bottom-up characteristics and difficult to generate a void in the film.

FIG. 14C is a diagram illustrating an example of a second film deposition process of the method of processing the substrate according to the embodiment of the present invention. In the second film deposition process, a silicon oxide film is further deposited on the silicon oxide film 90 etched so as to have the V-shaped hole therein in the first etching process, thereby increasing the film thickness of the silicon oxide film 90. Because the film is deposited on the silicon oxide film 90 etched so as to have the V-shaped hole, the entrance is not blocked during the film deposition, and the film can be deposited from the bottom portion of the silicon oxide film 90.

Here, because the operation of the substrate processing apparatus only has to be performed in a similar manner to the first film deposition process described in FIG. 14A, the description is omitted.

FIG. 14D is a diagram illustrating an example of a second etching process of the method of processing the substrate according to the embodiment of the present invention. In the second etching process, the silicon oxide film 90 is etched so as to have a V-shaped hole as well as the first etching process. Here, because the operation of the substrate processing apparatus only has to be similar to the operation in the first etching process described in FIG. 14B, the description is omitted.

FIG. 14E is a diagram illustrating an example of a third film deposition process of the method of processing the substrate according to the embodiment of the present invention. In the third film deposition process, an additional silicon oxide film 90 is further deposited on the silicon oxide film 90 etched into the V shape as well as the second film deposition process.

FIGS. 15A through 15D are diagrams illustrating an example of processes of a second half of the method of processing the substrate according to the embodiment of the present invention. FIG. 15A is a diagram illustrating an example of a third etching process of the method of processing the substrate according to the embodiment of the present invention. FIG. 15B is a diagram illustrating an example of a fourth film deposition process of the method of processing the substrate according to the embodiment of the present invention. FIG. 15C is a diagram illustrating an example of a fourth etching process of the method of processing the substrate according to the embodiment of the present invention. FIG. 15D is a diagram illustrating an example of a final filling process of the method of processing the substrate according to the embodiment of the present invention.

As illustrated in FIG. 15A through 15C, the etching, the film deposition, and the etching are repeated required number of times, and the via hole 80 is filled with a silicon oxide film while preventing a void from being generated in the silicon oxide film 90. The number of repetitions of the etching process and the film deposition process can be set at a proper number of times depending on a shape of the via hole 80 including an aspect ratio of the concave-shaped pattern. When the aspect ratio is great, the number of repetitions increases. Moreover, the number of repetitions is inferred to be more in filling a via hole than in filling a trench.

After repeating the etching processes and the film deposition processes illustrated in FIGS. 14B through 14E and FIGS. 15A through 15C, as illustrated in FIG. 15D, finally, the via hole 80 is fully filled with the silicon oxide film 90.

Thus, by repeating the film deposition process and the V-shaped etching, filling without a void can be performed.

Here, in the etching process performed in the second half, when decreasing the surface roughness of the etched silicon oxide film is more important than forming the V-shaped hole, the etching for preventing the surface roughness may be performed by setting the rotational speed of the turntable 2 at a high speed. In this manner, by controlling the rotational speed of the turntable 2 depending on a process, performing a desired filling is possible. Here, setting the rotational speed of the turntable 2 may be performed by the control unit 100 based on a recipe.

Furthermore, although the description has been given of the example of performing the film deposition for filling the concave-shaped pattern formed in the surface of the wafer W by repeating the film deposition process and the etching process in the embodiment, by carrying a wafer W deposited from the beginning, only the etching may be performed. Moreover, by supplying film deposition gases from both of the first and second film deposition gas nozzles 311 and 312, respectively, and supplying etching gases from both of the first and second etching gas nozzles 321 and 322, respectively, while rotating the turntable 2 in a counterclockwise fashion, the film deposition and the etching may be repeated in sequence within one revolution of the turntable 2.

According to the embodiments of the present invention, a desired substrate process can be performed while controlling etching conditions.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A method of processing a substrate, the method comprising steps of:
    placing a substrate on a turntable provided in a process chamber, the process chamber including a process area for supplying an etching gas and a purge area for supplying a purge gas, the process area and the purge area being arranged along a rotational direction of the turntable and divided from each other;
    supplying the etching gas into the process area;
    supplying the purge gas into the purge area;
    rotating the turntable to cause the substrate placed on the turntable to pass through the process area and the purge area once per revolution, respectively;
    etching a film deposited on a surface of the substrate by rotating the turntable at a first rotational speed under a first etching condition; and
    etching the film deposited on the surface of the substrate by rotating the turntable at a second rotational speed that is faster than the first rotational speed under a second etching condition.

2. The method as claimed in claim 1, wherein a first etching rate that results from the rotation of the turntable at the first rotational speed is higher than a second etching rate that results from the rotation of the turntable at the second rotational speed, and a lower surface roughness of the film is achieved by rotating the turntable at the second rotational speed than rotating the turntable at the first rotational speed.

3. The method as claimed in claim 1, wherein the substrate has a concave-shaped pattern formed in the surface thereof, and the film is deposited so as to have a concave shape so as to cover the concave-shaped pattern therealong, the film deposited on the concave-shaped pattern being etched by rotating the turntable at the first rotational speed to form a cross section of a V shape in the film deposited on the concave-shaped pattern.

4. The method as claimed in claim 1, wherein the substrate has a concave-shaped pattern formed in the surface thereof, and the film is deposited to have a concave shape so as to cover the concave-shaped pattern therealong, the film deposited on the concave-shaped pattern being etched by rotating the turntable at the second rotational speed not to form a cross section of a V shape in the film deposited on the concave-shaped pattern but to form a smooth surface in the film.

5. The method as claimed in claim 3, wherein the process chamber includes a second process area to supply a source gas for a film deposition and the process area is configured to be able to supply a reaction gas for the film deposition in addition to the etching gas, and further comprising a step of:
    depositing the film to be etched in the step of etching the film on the surface of the substrate including the concave-shaped pattern.

6. The method as claimed in claim 5,
    wherein the step of etching the film includes a V-shape etching step of etching the film deposited on the concave-shaped pattern to have the cross section of the V shape.

7. The method as claimed in claim 6,
    wherein the step of depositing the film and the V-shape etching step are alternately repeated a plurality number of times.

8. The method as claimed in claim 7,
    wherein the step of depositing the film includes a step of supplying the source gas for the film deposition and the reaction gas for the film deposition into the process chamber without supplying the etching gas into the process chamber while continuously rotating the turntable first multiple times, and
    wherein the V-shape etching step includes a step of supplying the etching gas and the purge gas into the process chamber without supplying the source gas for the film deposition and the reaction gas for the film deposition while continuously rotating the turntable second multiple times.

9. The method as claimed in claim 7, wherein the source gas for the film deposition, the reaction gas for the film deposition, the etching gas and the purge gas are supplied at the same time while continuously rotating the turntable multiple times, thereby repeating a cycle of performing each of the step of depositing the film and the V-shape etching step once per revolution of the turntable the multiple times.

10. The method as claimed in claim 6, wherein the step of etching the film includes a surface roughness preventing step of decreasing the surface roughness of the film.

11. The method as claimed in claim 5, wherein a change of the rotational speed of the turntable is performed by increasing or decreasing the rotational speed with reference to a reference speed, the reference speed being set at a rotational speed of the turntable in the step of depositing the film.

* * * * *